(12) United States Patent
Lee et al.

(10) Patent No.: US 12,507,573 B2
(45) Date of Patent: Dec. 23, 2025

(54) DISPLAY PANEL, ELECTRONIC DEVICE INCLUDING THE SAME, AND METHOD FOR MANUFACTURING DISPLAY PANEL

(71) Applicant: Samsung Display Co., Ltd., Yongin-si (KR)

(72) Inventors: Seho Lee, Cheonan-si (KR); Taehyung Kim, Seoul (KR); Jihwan Yoon, Yongin-si (KR); Yongdae Lee, Seongnam-si (KR); Sangwoo Pyo, Seongnam-si (KR); Jaehoon Hwang, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 605 days.

(21) Appl. No.: 17/903,572

(22) Filed: Sep. 6, 2022

(65) Prior Publication Data

US 2023/0130009 A1   Apr. 27, 2023

(30) Foreign Application Priority Data

Oct. 22, 2021   (KR) .................. 10-2021-0141463

(51) Int. Cl.
*H01L 27/32* (2006.01)
*H01L 51/52* (2006.01)
(Continued)

(52) U.S. Cl.
CPC ....... *H10K 59/80522* (2023.02); *H10K 50/13* (2023.02); *H10K 50/19* (2023.02);
(Continued)

(58) Field of Classification Search
CPC .. H10K 59/32; H10K 59/80522; H10K 50/13; H10K 50/19; H10K 50/824; H10K 71/162
See application file for complete search history.

(56) References Cited

U.S. PATENT DOCUMENTS 9,076,983 B2   7/2015   Kim et al.
9,515,294 B2   12/2016   Han et al.
(Continued)

FOREIGN PATENT DOCUMENTS

JP   2001212796 A   *   8/2001   ............ B23K 26/06
JP   2020004674         1/2020
(Continued)

OTHER PUBLICATIONS

Machine translation, Paek, Korean Pat. Pub. No. KR20150030440A, translation date: Mar. 19, 2025, Espacenet, all pages. (Year: 2025).*

(Continued)

*Primary Examiner* — Victoria K. Hall
(74) *Attorney, Agent, or Firm* — CANTOR COLBURN LLP

(57) ABSTRACT

A display panel includes a circuit layer on a base substrate, a first electrode and an auxiliary electrode disposed on the circuit layer, and spaced apart from each other, a charge generation layer on the first electrode and the auxiliary electrode, a first opening region being defined in the charge generation layer, a second electrode on the charge generation layer, a first organic layer disposed between the first electrode and the charge generation layer, a second opening region being defined in the first organic layer, and a second organic layer disposed between the charge generation layer and the second electrode, a third opening region being defined in the second organic layer. The second electrode is electrically connected to the auxiliary electrode through the first to third opening regions, and the second organic layer includes a protrusion adjacent to the third opening region.

21 Claims, 18 Drawing Sheets

(51) Int. Cl.
  *H01L 51/56* (2006.01)
  *H10K 50/13* (2023.01)
  *H10K 50/19* (2023.01)
  *H10K 50/824* (2023.01)
  *H10K 50/844* (2023.01)
  *H10K 59/32* (2023.01)
  *H10K 59/80* (2023.01)
  *H10K 71/00* (2023.01)
  *H10K 71/16* (2023.01)
  *H10K 59/35* (2023.01)

(52) U.S. Cl.
  CPC ......... *H10K 50/824* (2023.02); *H10K 50/844* (2023.02); *H10K 59/32* (2023.02); *H10K 59/8052* (2023.02); *H10K 71/00* (2023.02); *H10K 71/162* (2023.02); *H10K 59/352* (2023.02); *H10K 59/353* (2023.02)

(56) References Cited

U.S. PATENT DOCUMENTS

| | | | |
|---|---|---|---|
| 9,780,158 | B2 | 10/2017 | Lee et al. |
| 9,871,090 | B2 | 1/2018 | Lee et al. |
| 10,020,461 | B2 | 7/2018 | Park et al. |
| 10,147,769 | B2 | 12/2018 | Lee et al. |
| 10,910,587 | B2 | 2/2021 | Pyo et al. |
| 11,043,649 | B2 | 6/2021 | Yang et al. |
| 11,158,700 | B2 | 10/2021 | Beak et al. |
| 11,522,028 | B2 | 12/2022 | Lim et al. |
| 2006/0024855 | A1 | 2/2006 | Sano |
| 2017/0200776 | A1* | 7/2017 | Park ................ H10K 59/80522 |
| 2018/0006106 | A1* | 1/2018 | Oh ..................... H10K 50/828 |
| 2019/0245159 | A1* | 8/2019 | Kim .................. H10K 59/8722 |

FOREIGN PATENT DOCUMENTS

| | | | |
|---|---|---|---|
| KR | 1020060047228 A | 5/2006 | |
| KR | 20150030440 A * | 3/2015 | ............ H10K 71/10 |
| KR | 1020150030440 A * | 3/2015 | ........... H10K 50/805 |
| KR | 10-2015-0102180 | 9/2015 | |
| KR | 1020170044805 A | 4/2017 | |
| KR | 10-2018-0009441 | 1/2018 | |
| KR | 10-2018-0040765 | 4/2018 | |
| KR | 10-2018-0075056 | 7/2018 | |
| KR | 10-2019-0123829 | 11/2019 | |
| KR | 10-2021-0017179 | 2/2021 | |
| KR | 10-2313362 | 10/2021 | |

OTHER PUBLICATIONS

Machine translation, Paek, Korean Pat. Pub. No. KR102122598B1, translation date: Mar. 19, 2025, Espacenet, all pages. (Year: 2025).*
Korean Intellectual Property Office, Request for the Submission of an Opinion, Korean Application No. 10-2021-014163, Jul. 2, 2025, all pages. (Year: 2025).*
Korean Intellectual Property Office, Written Opinion, Korean Application No. 10-2021-014163, Jul. 29, 2025, all pages. (Year: 2025).*
Machine translation, Koide, Japanese Pat. Pub. No. JP-2001212796-A, translation date: Sep. 9, 2025, all pages. (Year: 2025).*

* cited by examiner

DISPLAY PANEL, ELECTRONIC DEVICE INCLUDING THE SAME, AND METHOD FOR MANUFACTURING DISPLAY PANEL

CROSS-REFERENCE TO RELATED APPLICATIONS

This application claims priority to and benefits of Korean Patent Application No. 10-2021-0141463 under 35 U.S.C. § 119 filed on Oct. 22, 2021, in the Korean Intellectual Property Office (KIPO), the entire contents of which are incorporated herein by reference.

BACKGROUND

Embodiments of the disclosure described herein relate to a display panel, an electronic device including the same, and a method for manufacturing a display panel, and more particularly, to a display panel and a method for manufacturing the same with improved reliability.

Multimedia electronic devices such as a television, a mobile phone, a tablet computer, a navigation, a game console, and the like may include a display panel for displaying an image. The display panel may include pixels, and each of the pixels may include a light emitting element that generates light and a driving element connected to the light emitting element.

A display panel including an organic light emitting element as the light emitting element is attracting attention as a next-generation display panel because of advantages such as a wide viewing angle, a fast response speed, a low power consumption, and the like. However, there is a problem in that luminance of the display panel is non-uniform as an area of the electronic device increases.

SUMMARY

Embodiments of the disclosure provide a display panel and a method for manufacturing the same having uniform luminance and improved reliability, and provide an electronic device including a display panel having improved reliability.

According to an embodiment, a display panel includes a circuit layer disposed on a base substrate; a first electrode disposed in a first region on the circuit layer; an auxiliary electrode disposed in a second region on the circuit layer and spaced apart from the first electrode; a charge generation layer disposed on the first electrode and the auxiliary electrode, a first opening region being defined in the charge generation layer; a second electrode disposed on the charge generation layer; a first organic layer disposed between the first electrode and the charge generation layer, a second opening region being defined in the first organic layer; and a second organic layer disposed between the charge generation layer and the second electrode, a third opening region being defined in the second organic layer. The second electrode is electrically connected to the auxiliary electrode through the first to third opening regions, and the second organic layer includes a protrusion adjacent to the third opening region.

The charge generation layer may include a curved surface adjacent to the first opening region, and the second electrode may be spaced apart from the curved surface of the charge generation layer.

The second organic layer may cover the curved surface of the charge generation layer.

The curved surface of the charge generation layer may overlap the protrusion of the second organic layer in a plan view.

The protrusion of the second organic layer may surround the third opening region in a plan view.

The protrusion of the second organic layer may have a ring shape surrounding the third opening region in a plan view, and a diameter of the protrusion of the second organic layer may be equal to or greater than about 1.2 times and equal to or smaller than about 1.4 times a diameter of the third opening region.

A thickness from a top surface of the protrusion of the second organic layer to a bottom surface of the first organic layer may be equal to or greater than about 1.3 times and equal to or smaller than about 1.5 times a thickness from a top surface of a portion of the second organic layer not overlapping the protrusion of the second organic layer to the bottom surface of the first organic layer.

The charge generation layer may contain a metallic material.

A thickness of the charge generation layer may be equal to or greater than about 1 angstrom (Å) and equal to or smaller than about 150 angstrom (Å).

The first organic layer may include a first light emitting layer overlapping the first electrode in a plan view, the second organic layer may include a second light emitting layer overlapping the first electrode in a plan view, and a color of light emitted from the first light emitting layer may be different from a color of light emitted from the second light emitting layer.

The first organic layer may include a first light emitting layer overlapping the first electrode in a plan view, the second organic layer may include a second light emitting layer overlapping the first electrode in a plan view, and a color of light emitted from the first light emitting layer may be substantially identical to a color of light emitted from the second light emitting layer.

The display panel may further include a capping layer disposed on the second electrode, and an encapsulation layer disposed on the capping layer, and the encapsulation layer may include a plurality of inorganic films and at least one organic film disposed between the plurality of inorganic films.

According to another embodiment, an electronic device includes a display panel that displays an image; an electronic module disposed beneath the display panel; and a casing accommodating the display panel and the electronic module. The display panel includes a circuit layer disposed on a base substrate; a first electrode disposed in a first region on the circuit layer; an auxiliary electrode disposed in a second region on the circuit layer and spaced apart from the first electrode; a second electrode disposed on the first electrode and the auxiliary electrode; a plurality of organic layers disposed between the first electrode and the second electrode; and at least one charge generation layer disposed between the plurality of organic layers. Each of the plurality of organic layers and the charge generation layer includes an opening region, the second electrode is electrically connected to the auxiliary electrode through the opening region, and an organic layer disposed adjacent to the second electrode among the plurality of organic layers includes a protrusion adjacent to the opening region.

The charge generation layer may include a curved surface adjacent to the opening region, the curved surface of the charge generation layer may be spaced apart from the second electrode, and the protrusion of the organic layer may be disposed between the curved surface of the charge generation layer and the second electrode.

The protrusion of the organic layer may surround the opening region in a plan view.

According to another embodiment, a method for manufacturing a display panel includes providing a target substrate including a pixel electrode, and an auxiliary electrode, the auxiliary electrode and the pixel electrode being disposed on a same layer; forming a light emitting stack including a charge generation layer on the pixel electrode and the auxiliary electrode; forming an opening region penetrating the light emitting stack and a protrusion adjacent to the opening region by irradiating a laser onto the light emitting stack overlapping the auxiliary electrode in a plan view; and forming a common electrode on the light emitting stack. The common electrode is electrically connected to the auxiliary electrode through the opening region.

The forming of the opening region may include bending an end of the charge generation layer adjacent to the opening region, and the common electrode formed to overlap the opening region in a plan view may be spaced apart from the end of the charge generation layer.

The laser may be a Gaussian beam.

A fluence of the laser may be equal to or lower than about 200 mJ/cm$^2$.

A wavelength of the laser may be equal to or greater than about 300 nm and equal to or smaller than about 400 nm.

The protrusion of the light emitting stack may be formed simultaneously in the forming of the opening region by the laser, and the protrusion of the light emitting stack may surround the opening region in a plan view.

BRIEF DESCRIPTION OF THE DRAWINGS

The above and other objects and features of the disclosure will become apparent by describing in detail embodiments thereof with reference to the accompanying drawings.

DETAILED DESCRIPTION OF THE EMBODIMENTS

Figure 1A:
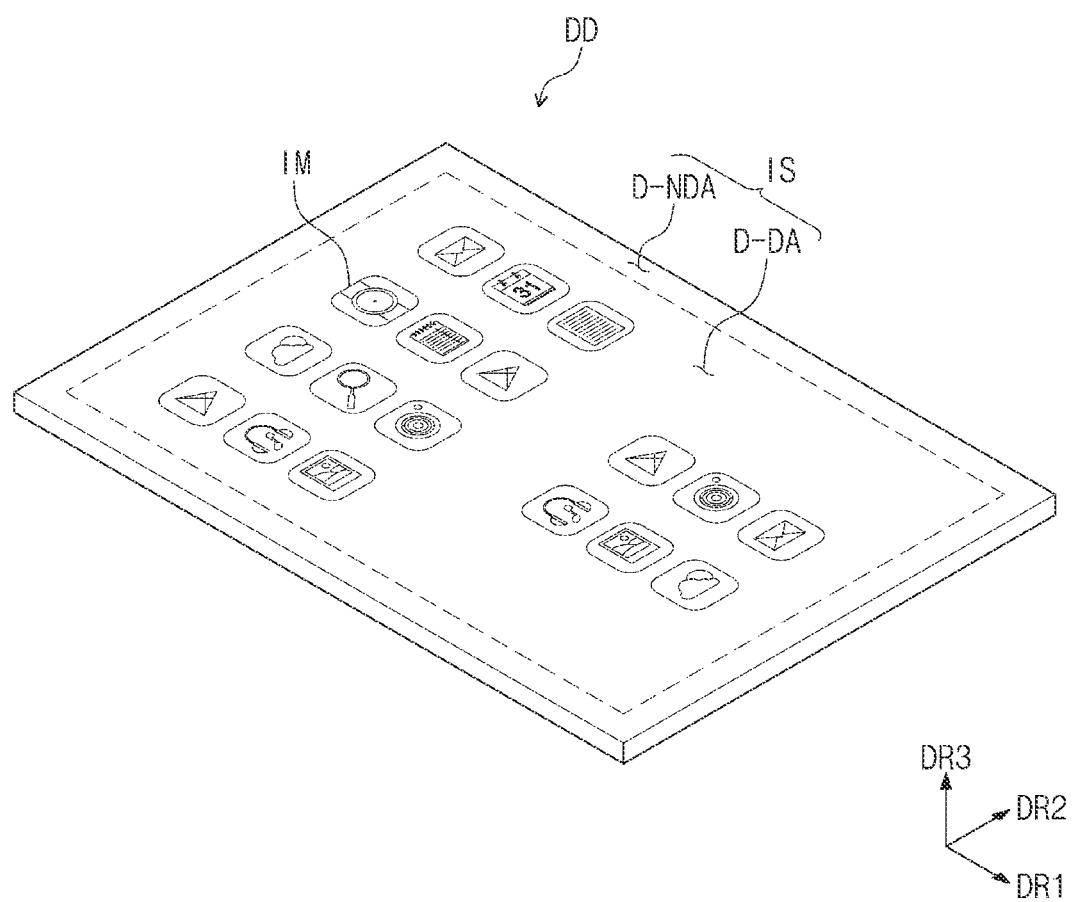
FIG. 1A is a schematic perspective view of an electronic device according to an embodiment of the disclosure.

The disclosure may make various changes and may have various forms, so that the disclosure is intended to illustrate specific embodiments in the drawings and describe the specific embodiments in detail in the text. However, this is not intended to limit the disclosure to a specific form of disclosure, and it should be understood to include all modifications, equivalents, or substitutes included in the spirit and scope of the disclosure.

In the specification, when a component (or a region, a layer, a portion, and the like) is referred to as being "on", "connected to", or "coupled to" another component, it means that the component may be directly disposed/connected/coupled on another component or a third component may be disposed between the component and another component. It will be understood that the terms "contact," "connected to," and "coupled to" may include a physical and/or electrical contact, connection, or coupling.

Like reference numerals refer to like components. In addition, in the drawings, thicknesses, ratios, and dimensions of components may be exaggerated for effective description of technical content. The term "and/or" includes all of one or more combinations that the associated components may define.

Terms such as first, second, and the like may be used to describe various components, but the components should not be limited by the terms. The above terms are used only for the purpose of distinguishing one component from another. For example, without departing from the scope of the disclosure, a first component may be named as a second component, and similarly, the second component may also be named as the first component. The singular expression includes the plural expression (or meaning) unless the context clearly dictates otherwise.

In addition, terms such as "beneath", "below", "on", "above" are used to describe the relationship of the components shown in the drawings. The above terms are relative concepts, and are described with reference to directions indicated in the drawings. In the specification, the phrase "disposed on" may refer to a case of being disposed not only on top of, but also beneath one member.

It should be understood that terms such as "comprise," "include" or "have" are intended to specify that a feature, a number, a step, an operation, a component, a part, or a combination thereof described in the specification is present, and do not preclude a possibility of addition or existence of one or more other features or numbers, steps, operations, components, parts, or combinations thereof.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The phrase "at least one of" is intended to include the meaning of "at least one selected from the group of" for the purpose of its meaning and interpretation. For example, "at least one of A and B" may be understood to mean "A, B, or A and B."

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

Unless otherwise defined or implied herein, all terms including technical and scientific terms used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and the disclosure, and will not be interpreted in an idealized or overly formal sense unless clearly so defined herein.

Hereinafter, a display panel, an electronic device including the display panel, and a method for manufacturing the display panel according to an embodiment of the disclosure will be described with reference to the drawings.

Figure 1B:
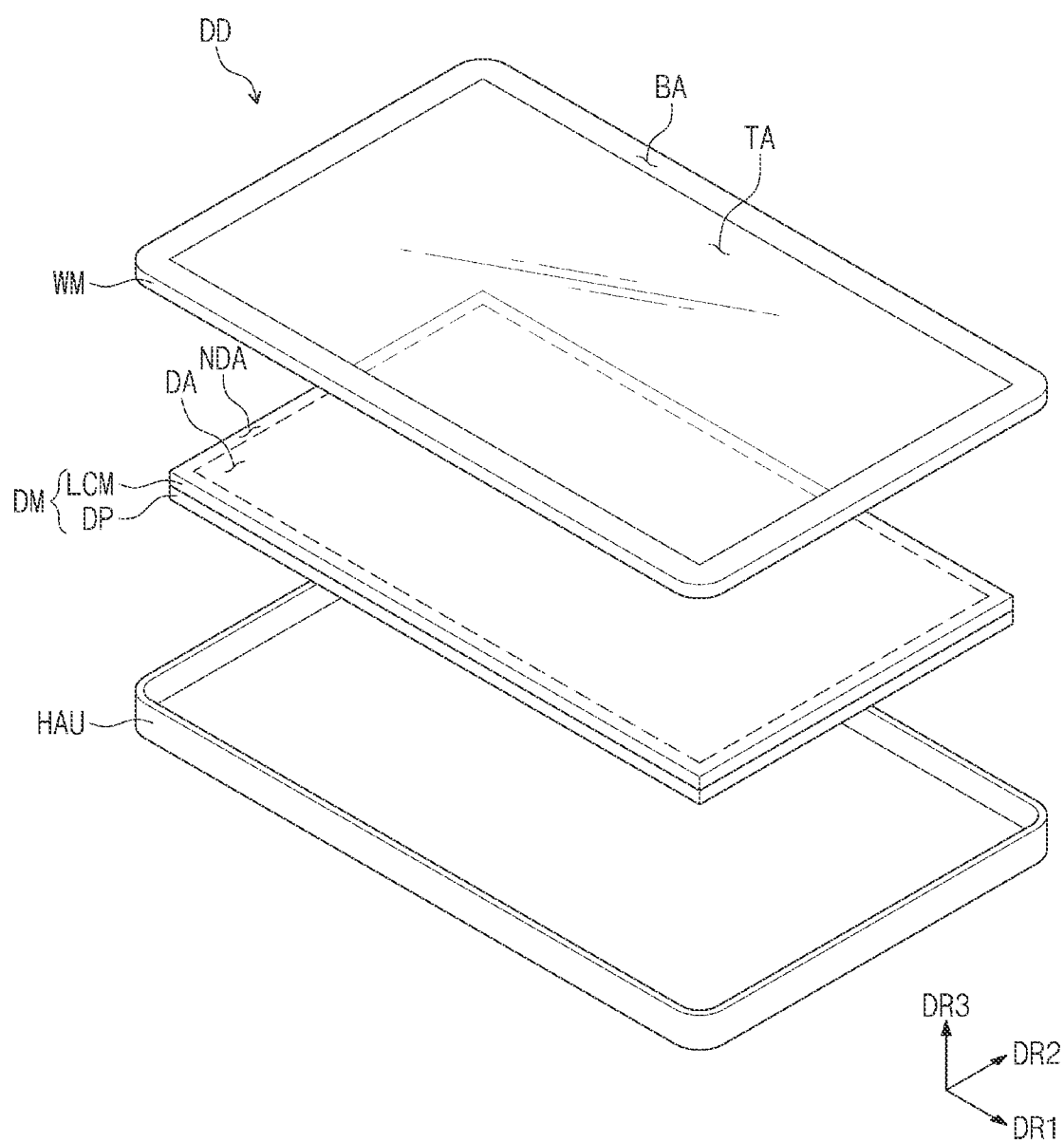
FIG. 1B is a schematic exploded perspective view of an electronic device according to an embodiment of the disclosure.
Figure 1C:
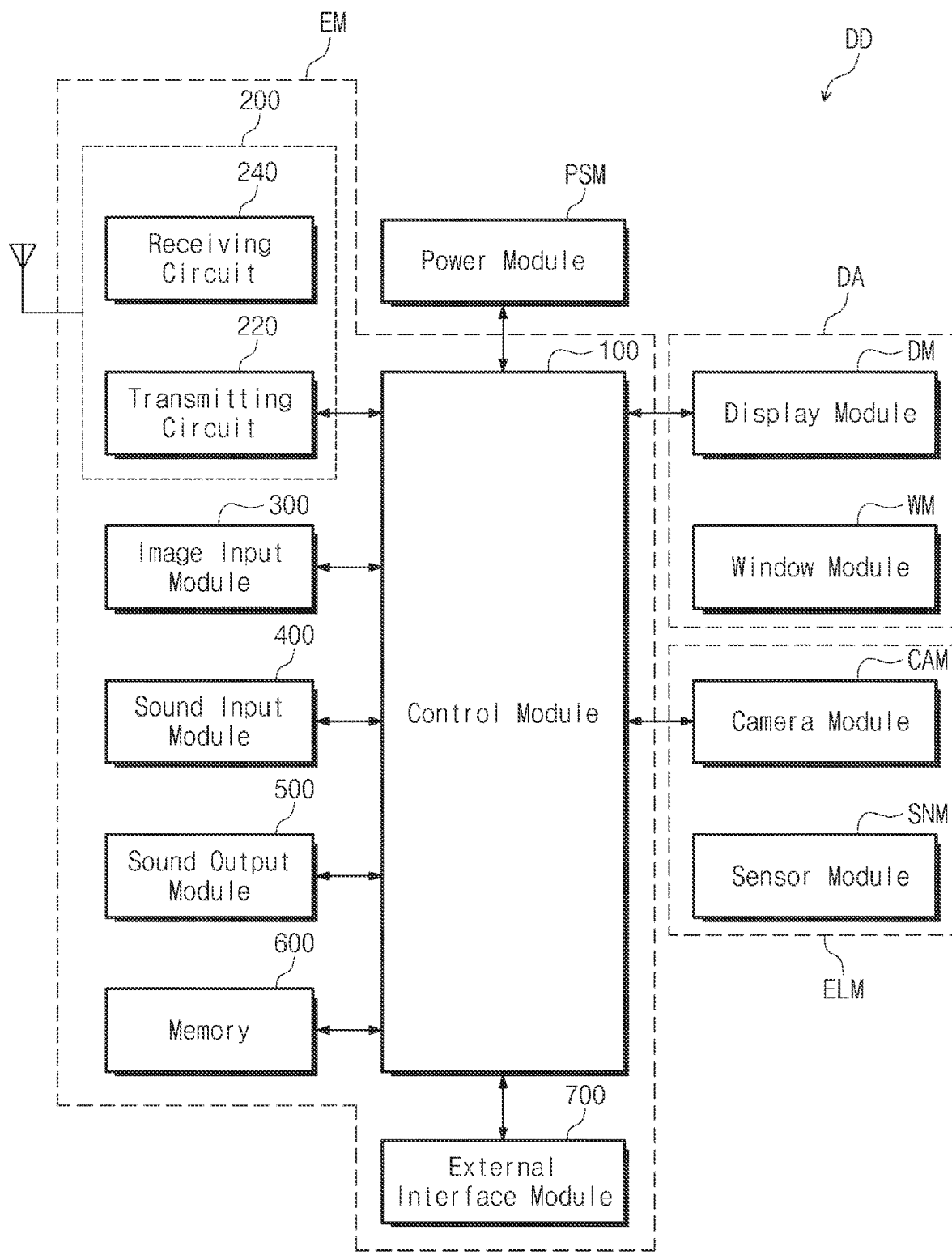
FIG. 1C is a schematic block diagram of an electronic device according to an embodiment of the disclosure.

FIG. 1A is a schematic perspective view of an electronic device according to an embodiment. FIG. 1B is a schematic exploded perspective view of an electronic device shown in FIG. 1A. FIG. 1C is a schematic block diagram of an electronic device according to an embodiment.

An electronic device DD may be a device that is activated based on an electrical signal and displays an image. The electronic device DD may include various embodiments, and, for example, the electronic device DD may include not only a large device such as a television, an outdoor billboard, and the like, but also a small and medium-sized device such as a monitor, a mobile phone, a tablet computer, a navigation, a game console, and the like. However, the embodiments of the electronic device DD are some of example embodiments, and the electronic device DD is not limited to an embodiment unless departing from the concept of the disclosure.

Referring to FIG. 1A, the electronic device DD may have a rectangular shape having long sides extending in a first direction DR1 and short sides extending in a second direction DR2 in a plan view. However, the disclosure may not be limited thereto, and the electronic device DD may have various shapes such as a circular shape, a polygonal shape, and the like.

The electronic device DD may display an image IM in a third direction DR3 through a display surface IS parallel to the plane defined by the first direction DR1 and the second direction DR2. The third direction DR3 may be parallel to a normal direction of the display surface IS. The display surface IS on which the image IM is displayed may correspond to a front surface of the electronic device DD. In the embodiment, the image IM may include a still image as well as a dynamic image. FIG. 1A illustrates icon images as an example of the image IM.

In the embodiment, a front surface (or a top surface) and a rear surface (or a bottom surface) of each member (or unit) may be defined based on the direction in which the image IM is displayed. The front surface and the rear surface may be opposite to each other in the third direction DR3, and normal directions of the front surface and the rear surface may be parallel to the third direction DR3. A separation distance between the front surface and the rear surface defined in the third direction DR3 may correspond to a thickness of the member (or the unit).

In the specification, "when viewed in a plan view" or "in a plan view" may be defined as a state viewed in the third direction DR3. In the specification, "in a cross-sectional view" may be defined as a state viewed in the first direction DR1 or the second direction DR2. In an example, the directions indicated by the first to third directions DR1, DR2, and DR3 are relative concepts and may be converted into other directions.

FIG. 1A illustrates as an example the electronic device DD having the flat display surface IS. However, the shape of the display surface IS of the electronic device DD may not be limited thereto, and the display surface IS may be curved or three-dimensional.

The electronic device DD may be flexible. The term "flexible" may refer to a characteristic capable of being bent, and may include everything from a structure that is completely folded to a structure that may be bent at a scale of several nanometers. For example, the flexible electronic device DD may include a curved electronic device or a foldable electronic device. However, the disclosure may not be limited thereto, and the electronic device DD may be rigid.

The display surface IS of the electronic device DD may include a display portion D-DA and a non-display portion D-NDA. The display portion D-DA may be a portion displaying the image IM. A user may view the image IM through the display portion D-DA. In the embodiment, the display portion D-DA is illustrated as having a rectangular shape, but this is merely illustrative, and the display portion D-DA may have various shapes.

The non-display portion D-NDA may be a portion that does not display the image IM. The non-display portion D-NDA may correspond to a portion having a color and blocking light. The non-display portion D-NDA may be adjacent to the display portion D-DA. For example, the non-display portion D-NDA may be disposed outwardly of the display portion D-DA to surround the display portion D-DA. However, this is merely illustrative. The non-display portion D-NDA may be adjacent to only a side of the display portion D-DA, or may be disposed on a side surface other than the front surface of the electronic device DD. However, the disclosure may not be limited thereto, and the non-display portion D-NDA may be omitted.

In an embodiment, the electronic device DD may sense an external input applied from the outside. The external input may have various forms such as a pressure, a temperature, light, and the like provided from the outside. The external input may include an input (e.g., hovering) applied in proximity to the electronic device DD as well as an input of making contact with the electronic device DD (e.g., by a hand of the user or a pen).

Referring to FIG. 1B, the electronic device DD may include a window module WM, a display module DM, and a casing HAU. The display module DM may include a display panel DP and a light control member LCM.

The window module WM and the casing HAU may be coupled to each other to define an appearance of the electronic device DD, and may provide an interior space capable of accommodating components of the electronic device DD such as the display module DM.

The window module WM may be disposed on the display module DM. The window module WM may protect the display module DM from external impact. A front surface of the window module WM may correspond to the display surface IS of the electronic device DD described above. The front surface of the window module WM may include a transmission region TA and a bezel region BA.

The transmission region TA of the window module WM may be an optically transparent region. The window module WM may transmit the image provided by the display module DM through the transmission region TA, and the user may view the image. The transmission region TA may correspond to the display portion D-DA of the electronic device DD.

The window module WM may contain an optically transparent insulating material. For example, the window module WM may contain glass, sapphire, or plastic. The window module WM may have a single-layered or multi-layered structure. The window module WM may further include at least one functional layer such as an anti-fingerprint layer, a phase control layer, and a hard coating layer disposed on an optically transparent substrate.

The bezel region BA of the window module WM may be provided by depositing, coating, or printing a material, having a color, on a substrate of the window module WM. The bezel region BA of the window module WM may prevent a component of the display module DM, disposed to overlap the bezel region BA, from being viewed from the outside. The bezel region BA may correspond to the non-display portion D-NDA of the electronic device DD.

The display module DM may be disposed between the window module WM and the casing HAU. The display module DM may display the image based on an electrical signal. The display module DM may include a display region DA and a non-display region NDA adjacent to the display region DA.

The display region DA may be a region activated based on the electrical signal. The display region DA may be a region displaying the image provided from the display module DM. The display region DA of the display module DM may overlap the transmission region TA. In the specification, the words "regions/portions correspond to each other" mean "overlapping each other" and is not limited to having a same area and/or shape. The image displayed on the display region DA may be viewed from the outside through the transmission region TA.

The non-display region NDA may be adjacent to the display region DA. For example, the non-display region NDA may surround the display region DA. However, the disclosure may not be limited thereto, and the non-display region NDA may be defined in various shapes. The non-display region NDA may be a region in which a driving circuit or a driving wiring for driving the display region DA, various signal lines providing the electrical signals, and pads are disposed. The non-display region NDA of the display module DM may correspond to the bezel region BA. The components of the display module DM disposed in the non-display region NDA may be prevented from being viewed from the outside by the bezel region BA.

The display panel DP according to an embodiment may be a light emitting display panel, and may not be particularly limited. For example, the display panel DP may be an organic light emitting display panel, an inorganic light emitting display panel, or a quantum dot light emitting display panel. A light emitting layer of the organic light emitting display panel may contain an organic light emitting material, and a light emitting layer of the inorganic light emitting display panel may contain an inorganic light emitting material. A light emitting layer of the quantum dot light emitting display panel may contain a quantum dot, a quantum rod, and the like. In the embodiment, the display panel DP will be described as the organic light emitting display panel.

The light control member LCM may be disposed on the display panel DP. After being provided on the display panel DP, the light control member LCM may be coupled to the display panel DP by a bonding process using a sealing member. However, the disclosure may not be limited thereto, and the light control member LCM may be directly disposed on the display panel DP. In the specification, formation using continuous processes without disposition of a separate adhesive layer or adhesive member may be expressed as "directly disposed" or "disposed directly (on)." For example, the expression "the light control member LCM is directly disposed on the display panel DP" may represent that components of the light control member LCM are formed by the continuous processes on a base surface provided by the display panel DP after the display panel DP is formed.

The light control member LCM may include light control patterns capable of converting optical properties of source light provided by the display panel DP. The light control member LCM may selectively convert a wavelength or a color of the source light, or transmit the source light. The light control member LCM may control a color purity or a color gamut of light emitted from the electronic device DD, and may prevent reflection of external light incident from the outside of the electronic device DD.

The casing HAU may be disposed beneath the display module DM to accommodate the display module DM therein. The casing HAU may absorb the impact applied from the outside and may protect the display module DM by preventing foreign substances or moisture from penetrating into the display module DM. The casing HAU of an embodiment may be provided in a form in which accommodation members are coupled to each other.

In an example, the display module DM may further include an input sensing unit. The input sensing unit may acquire coordinate information of the external input applied from the outside of the electronic device DD. The input sensing unit may be placed between the display panel DP and the light control member LCM. For example, the input sensing unit may be directly disposed on the display panel DP by the continuous processes, or may be separately manufactured and attached to the display panel DP by a separate adhesive layer.

FIG. 1B briefly illustrates the components of the electronic device DD, but the electronic device DD of an embodiment may include various functional modules substantially as shown in FIG. 1C. Referring to FIG. 1C, the electronic device DD may include a first electronic module EM, a power module PSM, a display device DA, and a second electronic module ELM.

The first electronic module EM may include a control module 100, a wireless communication module 200, an image input module 300, a sound input module 400, a sound output module 500, a memory 600, an external interface module 700, and the like. The modules may be mounted on a circuit board or electrically connected to each other through or by a flexible circuit board. The first electronic module EM may be electrically connected to the power module PSM.

The control module 100 may control overall operations of the electronic device DD. For example, the control module 100 may activate or deactivate the display device DA to correspond to a user input. The control module 100 may control the image input module 300, the sound input module 400, and the sound output module 500 to correspond to the user input. The control module 100 may include at least one microprocessor.

The wireless communication module 200 may transmit/receive a wireless signal with (or to/from) another terminal using a Bluetooth or a Wi-Fi line. The wireless communication module 200 may transmit/receive a voice signal using a general communication line. The wireless communication module 200 may include a transmitting circuit 220 for modulating a signal to be transmitted and transmitting the modulated signal, and a receiving circuit 240 for demodulating the received signal.

The image input module 300 may process an image signal and convert the image signal into image data that may be displayed on the display device DA. The sound input module 400 may receive an external sound signal by a microphone in a recording mode, a voice recognition mode, or the like and convert the external sound signal into electrical voice data. The sound output module 500 may convert the sound data received from the wireless communication module 200 or sound data stored in the memory 600 and output the converted sound data to the outside.

The external interface module 700 may serve as an interface connected to an external charger, a wired/wireless data port, and a card socket (e.g., a memory card, and a SIM/UIM card).

The power module PSM may supply power required for the overall operations of the electronic device DD. The power module PSM may include a conventional battery device.

The second electronic module ELM may be an electronic component that outputs or receives an optical signal. In an embodiment, the second electronic module ELM may be disposed beneath the display module DM. The second electronic module ELM may transmit or receive the optical signal through a region (or partial region) of the display device DA. In the embodiment, the second electronic module ELM is illustrated as including a camera module CAM and a sensor module SNM, but the disclosure is not limited thereto.

Figure 2:
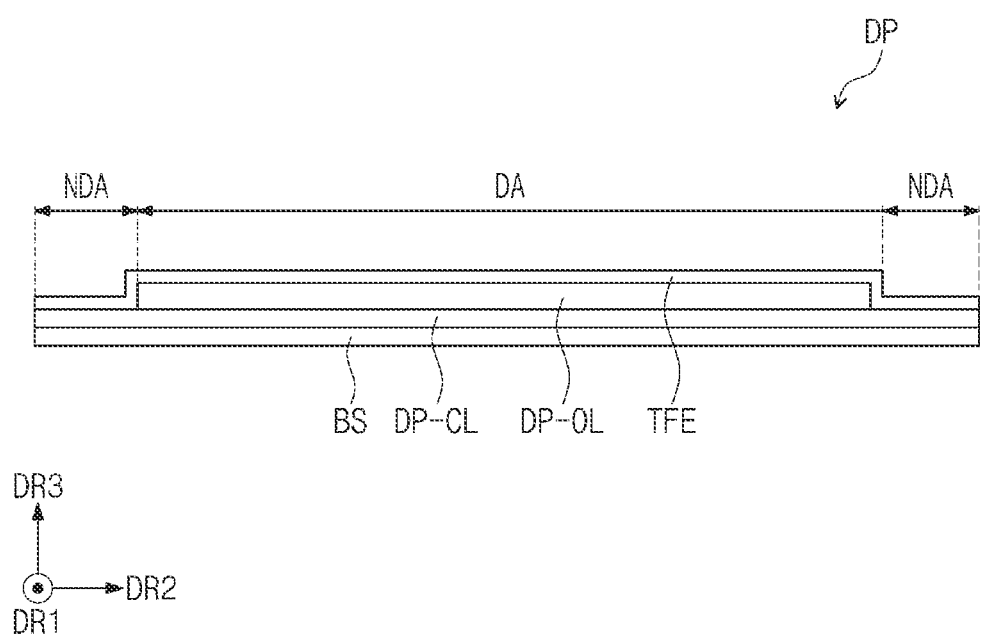
FIG. 2 is a schematic cross-sectional view of a display panel according to an embodiment of the disclosure.

FIG. 2 is a schematic cross-sectional view of a display panel according to an embodiment of the disclosure. Referring to FIG. 2, the display panel DP may include a base substrate BS, a circuit layer DP-CL, a display element layer DP-OL, and an encapsulation layer TFE.

The base substrate BS may include the display region DA and the non-display region NDA. The base substrate BS may provide the base surface on which the circuit layer DP-CL is disposed. The base substrate BS may be a rigid substrate, but may not be limited thereto, and may be a flexible substrate.

The circuit layer DP-CL may be disposed on the base substrate BS. The circuit layer DP-CL may include driving elements, signal lines, and signal pads. The display element layer DP-OL may include light emitting elements disposed to overlap the display region DA. The light emitting elements of the display element layer DP-OL may be electrically connected to the driving elements of the circuit layer DP-CL to provide the source light through the display region DA based on a signal of the driving element.

The encapsulation layer TFE may be disposed on the display element layer DP-OL to encapsulate the light emitting elements. The encapsulation layer TFE may include thin films. The thin films of the encapsulation layer TFE may be disposed to improve an optical efficiency of the light emitting elements or to protect the light emitting devices.

Figure 3A:
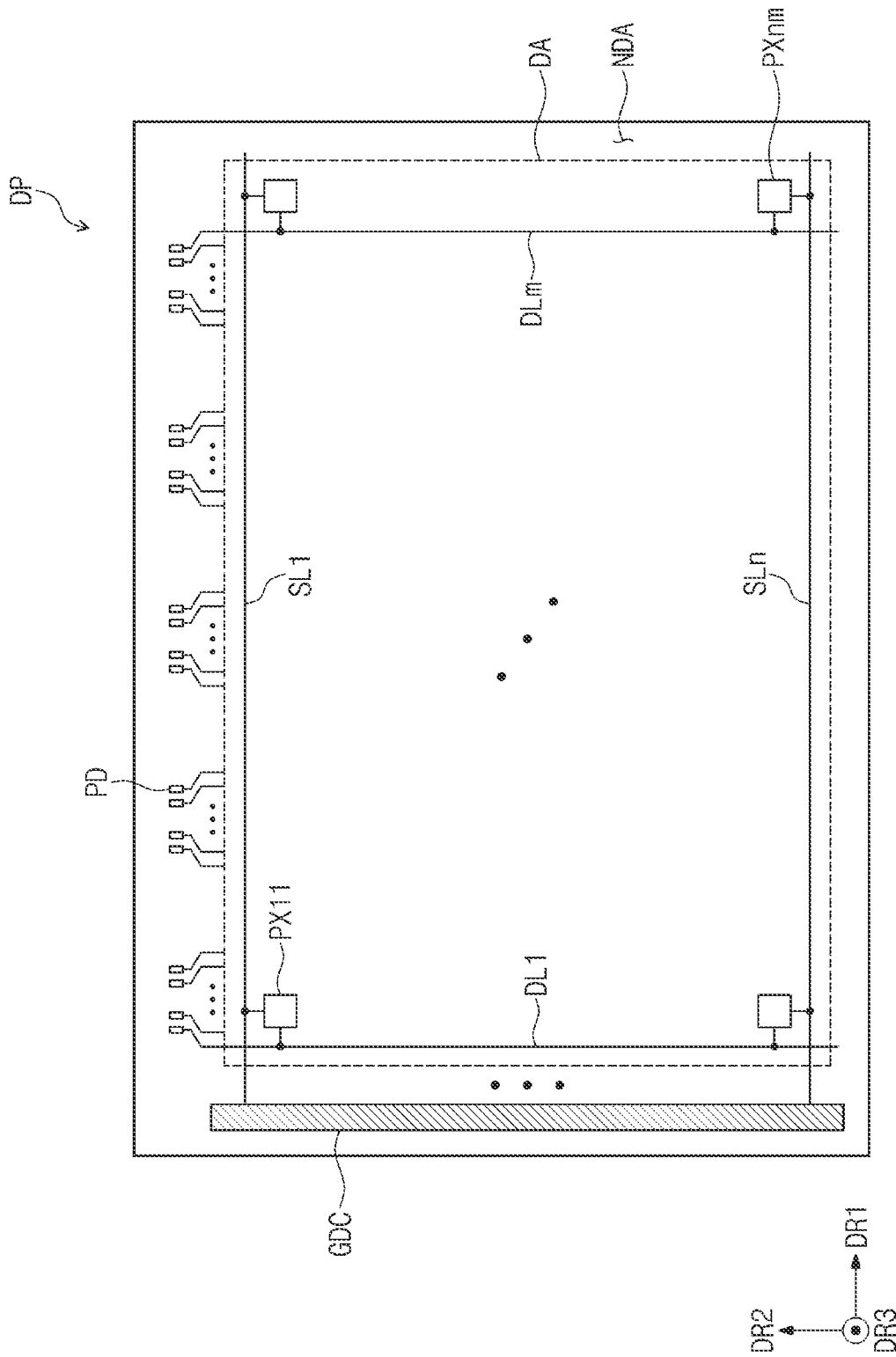
FIG. 3A is a schematic plan view of a display panel according to an embodiment of the disclosure.
Figure 3B:
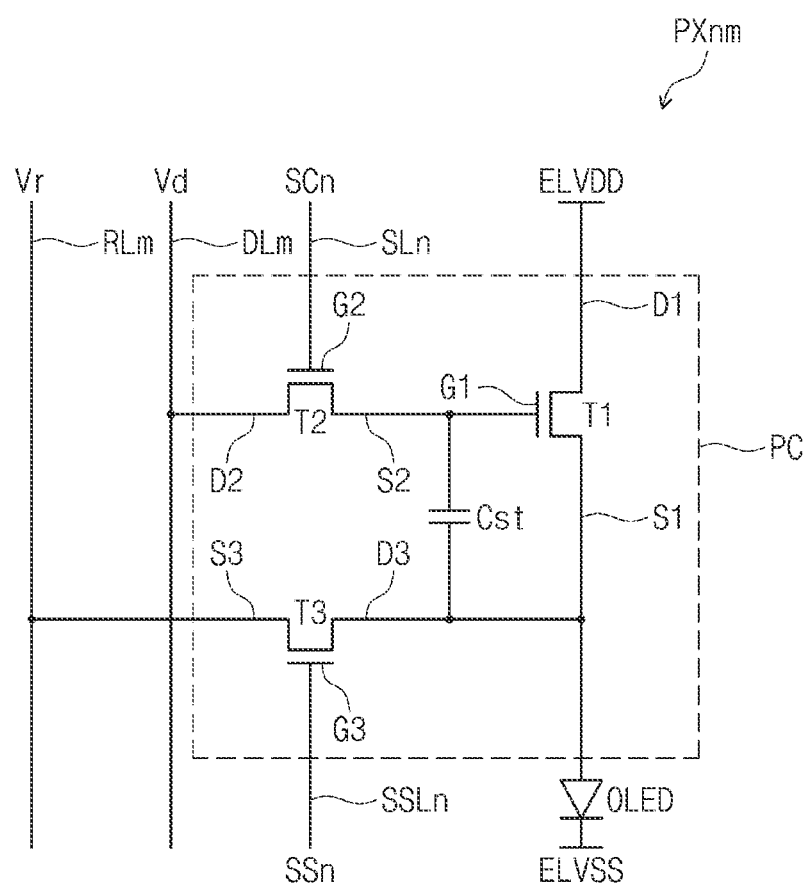
FIG. 3B is a schematic diagram of an equivalent circuit of a pixel according to an embodiment of the disclosure.

FIG. 3A is a schematic plan view of a display panel according to an embodiment of the disclosure. FIG. 3B is a schematic diagram of an equivalent circuit of a pixel according to an embodiment of the disclosure.

Referring to FIG. 3A, the display panel DP may include pixels PX11 to PXnm disposed in the display region DA and signal lines SL1 to SLn and DL1 to DLm electrically connected to the pixels PX11 to PXnm. The display panel DP may include a driving circuit GDC and pads PD disposed in the non-display region NDA.

Each of the pixels PX11 to PXnm may include a pixel driving circuit composed of a light emitting element, transistors (e.g., a switching transistor, a driving transistor, and the like) connected to the light emitting element, and at least one capacitor to be described below. Each of the pixels PX11 to PXnm may emit light in response to an electrical signal. Although FIG. 3A illustrates as an example the pixels PX11 to PXnm arranged in a matrix form, an arrangement form of the pixels PX11 to PXnm is not limited thereto.

The signal lines SL1 to SLn and DL1 to DLm may include scan lines SL1 to SLn and data lines DL1 to DLm. Each of the pixels PX11 to PXnm may be connected to a corresponding scan line among the scan lines SL1 to SLn and a corresponding data line among the data lines DL1 to DLm. In an example, depending on the components of the pixel driving circuit of each of the pixels PX11 to PXnm, more types of signal lines may be disposed on the display panel DP.

The driving circuit GDC may include a gate driving circuit. The gate driving circuit may generate gate signals and sequentially output the gate signals to the scan lines SL1 to SLn. The gate driving circuit may further output another control signal to the pixel driving circuit of each of the pixels PX11 to PXnm.

The driving circuit GDC and the pixels PX11 to PXnm according to an embodiment may include thin-film transistors formed through a low-temperature polycrystalline silicon (LTPS) process, a low-temperature polycrystalline oxide (LTPO) process, or an oxide semiconductor process.

The pads PD may be arranged in a direction on the non-display region NDA. The pads PD may be portions connected to the circuit board. The pads PD may be connected to corresponding signal lines among the signal lines SL1 to SLn and DL1 to DLm, respectively, and may be electrically connected to corresponding pixels by the signal lines, respectively. The pads PD may be integral with the signal lines SL1 to SLn and DL1 to DLm. However, the disclosure may not be limited thereto, the pads PD and the signal lines SL1 to SLn and DL1 to DLm may be disposed on different layers, and the pads PD may be connected to the signal lines SL1 to SLn and DL1 to DLm through contact holes.

FIG. 3B illustrates as an example a pixel PXnm connected to an n-th scan line SLn, an n-th sensing line SSLn, a m-th data line DLm, and a m-th reference line RLm. Referring to FIG. 3B, the pixel PXnm may include a pixel circuit PC and a light emitting element OLED connected to the pixel circuit PC.

The pixel circuit PC may include transistors T1, T2, and T3 and a capacitor Cst. The transistors T1, T2, and T3 may include a first transistor (or a driving transistor) T1, a second transistor (or a switch transistor) T2, and a third transistor (or a sensing transistor) T3. Each of the first to third transistors T1, T2, and T3 may be a thin-film transistor.

The first to third transistors T1, T2, and T3 may be N-channel metal oxide semiconductor (NMOS) transistors, but may not be limited thereto, and may be P-channel metal oxide semiconductor (PMOS) transistors. The first to third transistors T1, T2, and T3 may include sources S1, S2, and S3, drains D1, D2, and D3, and gates G1, G2, and G3, respectively.

The light emitting element OLED may be an organic light emitting element including an anode (or a first electrode) and a cathode (or a second electrode). The anode of the light emitting element OLED may receive a first voltage ELVDD through the driving transistor T1, and the cathode of the light emitting element OLED may receive a second voltage ELVSS. The light emitting element OLED may receive the first voltage ELVDD and the second voltage ELVSS to emit light.

The driving transistor T1 may include the drain D1 that receives the first voltage ELVDD, the source S1 connected to the anode of the light emitting element OLED, and the gate G1 connected to the capacitor Cst. The driving transistor T1 may control a driving current flowing through the light emitting element OLED from the first voltage ELVDD in response to a voltage value stored in the capacitor Cst.

The switch transistor T2 may include the drain D2 connected to the m-th data line DLm, the source S2 connected to the capacitor Cst, and the gate G2 that receives an n-th written scan signal SCn. The m-th data line DLm may receive a data voltage Vd and a data voltage for sensing. The switch transistor T2 may transfer the data voltage Vd, input from the m-th data line DLm, to the driving transistor T1 based on a switching voltage input from the n-th written scan signal SCn.

The sensing transistor T3 may include the source S3 connected to the m-th reference line RLm, the drain D3 connected to the anode of the light emitting element OLED, and the gate G3 that receives an n-th sampling scan signal SSn. The m-th reference line RLm may receive a reference voltage Vr.

The capacitor Cst may be connected to the gate G1 of the driving transistor T1 and the anode of the light emitting device OLED. The capacitor Cst may include a first capacitor electrode connected to the gate G1 of the driving transistor T1 and a second capacitor electrode connected to the anode of the light emitting device OLED. The capacitor Cst may store a voltage corresponding to a difference between the voltage transmitted from the switch transistor T2 and the first voltage ELVDD.

In an example, an equivalent circuit of the pixel PXnm is not limited to the equivalent circuit shown in FIG. 3B. In another embodiment of the disclosure, the equivalent circuit diagram of the pixel PXnm may be implemented in various forms for the light emitting element OLED to emit the light.

Figure 4:
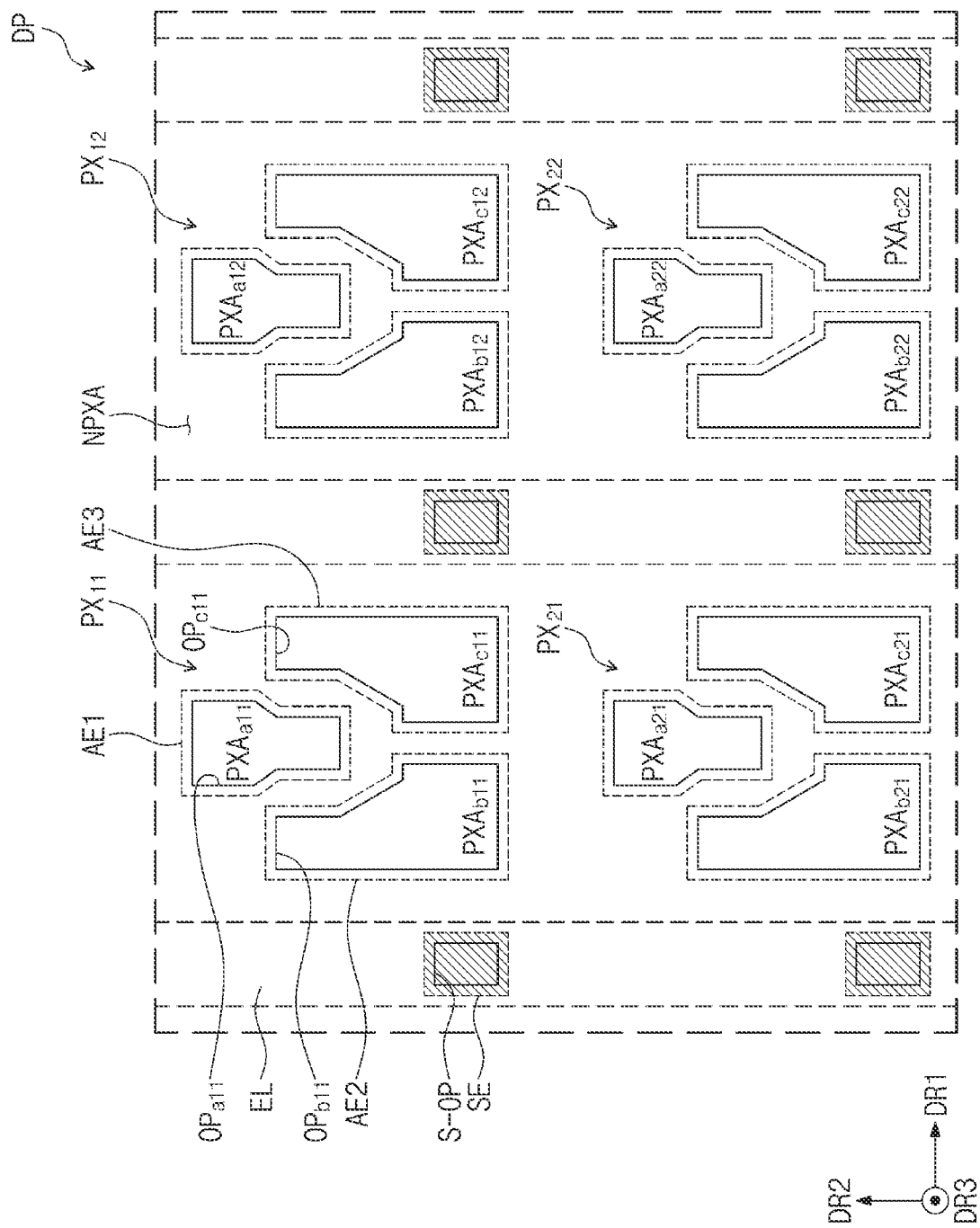
FIG. 4 is a schematic enlarged plan view of a display panel according to an embodiment of the disclosure.

FIG. 4 is a schematic enlarged plan view of a display panel according to an embodiment of the disclosure.

Referring to FIG. 4, each of the pixels PXnm (see FIG. 3A) of the display panel DP may include sub-pixels. FIG. 4 illustrates some pixels $PX_{11}$, $PX_{12}$, $PX_{21}$, and $PX_{22}$ among the pixels PXnm (see FIG. 3A). Hereinafter, the pixels $PX_{11}$, $PX_{12}$, $PX_{21}$, and $PX_{22}$ will be described based on a pixel $PX_{11}$ (hereinafter referred to as the pixel $PX_{11}$), and the description related to the pixel $PX_{11}$ may be applied to other pixels.

The sub-pixels of the pixel $PX_{11}$ may include light emitting elements, and the light emitting elements may include pixel electrodes AE1, AE2, and AE3 disposed on the base substrate BS (see FIG. 2). The pixel electrodes AE1, AE2, and AE3 may be disposed to be spaced apart from each other in a plan view (or when viewed in a plan). Each of the pixel electrodes AE1, AE2, and AE3 included in a pixel $PX_{11}$ may correspond to the sub-pixels constituting the pixel $PX_{11}$.

A pixel defining layer PDL may be disposed on the pixel electrodes AE1, AE2, and AE3. Light emitting openings $OP_{a11}$, $OP_{b11}$, and $OP_{c11}$ defined in the pixel defining layer PDL may correspond to the pixel electrodes AE1, AE2, and AE3 and expose at least a portion of the pixel electrodes AE1, AE2, and AE3, respectively.

The display region DA (see FIG. 3A) of the display panel DP may be divided into light emitting regions corresponding to the sub-pixels and a non-light emitting region NPXA surrounding the light emitting regions. FIG. 4 illustrates light emitting regions $PXA_{a11}$, $PXA_{b11}$, $PXA_{c11}$, $PXA_{a12}$, $PXA_{b12}$, $PXA_{c12}$, $PXA_{a21}$, $PXA_{b21}$, $PXA_{c21}$, $PXA_{a22}$, $PXA_{b22}$, and $PXA_{c22}$ included in some pixels $PX_{11}$, $PX_{12}$, $PX_{21}$, and $PX_{22}$. Hereinafter, the light emitting regions $PXA_{a11}$, $PXA_{b11}$, and $PXA_{c11}$ included in a pixel $PX_{11}$ will be described on the basis of the pixel $PX_{11}$.

The pixel defining layer PDL may define the light emitting regions $PXA_{a11}$, $PXA_{b11}$, and $PXA_{c11}$ and the non-light emitting region NPXA. The respective regions of the pixel electrodes AE1, AE2, and AE3 exposed by the light emitting openings $OP_{a11}$, $OP_{b11}$, and $OP_{c11}$ of the pixel defining layer PDL may be defined as the light emitting regions $PXA_{a11}$, $PXA_{b11}$, and $PXA_{c11}$, respectively, and a region that does not overlap the light emitting openings $OP_{a11}$, $OP_{b11}$, and $OP_{c11}$ of the pixel defining layer PDL may be defined as the non-light emitting region NPXA.

The light emitting regions $PXA_{a11}$, $PXA_{b11}$, and $PXA_{c11}$ may be spaced apart from each other with the non-light emitting region NPXA therebetween. The light emitting regions $PXA_{a11}$, $PXA_{b11}$, and $PXA_{c11}$ may correspond to regions from which light provided from the light emitting device of the pixel $PX_{11}$ is emitted, respectively.

The light emitting regions $PXA_{a11}$, $PXA_{b11}$, and $PXA_{c11}$ included in a pixel PX1 may include a first light emitting region $PXA_{a11}$, a second light emitting region $PXA_{b11}$, and a third light emitting region $PXA_{c11}$. The first to third light emitting regions $PXA_{a11}$, $PXA_{b11}$, and $PXA_{c11}$ may be distinguished based on a color of the light emitted toward the outside of the electronic device DD.

The first light emitting region $PXA_{a11}$ may correspond to a region emitting first color light, the second light emitting region PXA$_{b11}$ may correspond to a region emitting second color light, and the third light emitting region PXA$_{c11}$ may correspond to a region emitting third color light. In an embodiment, the first to third color light may have different colors. For example, the first color light may be blue light, the second color light may be green light, and the third color light may be red light. However, the embodiment is not necessarily limited thereto.

The non-light emitting region NPXA may set boundaries of the first to third light emitting regions PXA$_{a11}$, PXA$_{b11}$, and PXA$_{c11}$, and may prevent color mixing between the first to third light emitting regions PXA$_{a11}$, PXA$_{b11}$, and PXA$_{c11}$.

The first to third light emitting regions PXA$_{a11}$, PXA$_{b11}$, and PXA$_{c11}$ may have an arrangement in the display region DA (see FIG. 3A). The second light emitting region PXA$_{b11}$ and the third light emitting region PXA$_{c11}$ may be disposed in the first direction DR1 in a plan view. A center of the second light emitting region PXA$_{b11}$ and a center of the third light emitting region PXA$_{c11}$ may be parallel to the first direction DR1. The first light emitting region PXA$_{a11}$ may be disposed between the second light emitting region PXA$_{b11}$ and the third light emitting region PXA$_{c11}$ in a plan view.

In an example, the arrangement of the first to third light emitting regions PXA$_{a11}$, PXA$_{b11}$, and PXA$_{c11}$ shown in FIG. 4 is an example. However, the disclosure may not be limited thereto, and the arrangement of the light emitting regions may vary based on a design of the electronic device DD.

The first to third light emitting regions PXA$_{a11}$, PXA$_{b11}$, and PXA$_{c11}$ may have a polygonal shape in a plan view. The second light emitting region PXA$_{b11}$ may have a shape symmetrical to that of the third light emitting region PXA$_{c11}$ about a virtual axis extending in the second direction DR2. The first light emitting region PXA$_{a11}$ may have a polygonal shape different from that of the second light emitting region PXA$_{b11}$ and the third light emitting region PXA$_{c11}$ in a plan view.

The shapes and areas of the first to third light emitting regions PXA$_{a11}$, PXA$_{b11}$, and PXA$_{c11}$ may be variously designed in consideration of light output efficiency of the color emitted therethrough, and may not be limited to the embodiment shown in FIG. 4. For example, in an embodiment, the first to third light emitting regions PXA$_{a11}$, PXA$_{b11}$, and PXA$_{c11}$ may have a rectangular shape or a circular shape. As another example, in an embodiment, some of the first to third light emitting regions PXA$_{a11}$, PXA$_{b11}$, and PXA$_{c11}$ may have a rhombus shape and the others may have an octagonal shape. However, the disclosure may not be limited thereto, and the first to third light emitting regions PXA$_{a11}$, PXA$_{b11}$, and PXA$_{c11}$ may have a same shape.

The display panel DP may include an auxiliary wiring EL which is disposed on the base substrate BS (see FIG. 2) and to which the second voltage ELVSS (see FIG. 3B) is applied. The auxiliary wiring EL may be disposed to overlap the non-light emitting region NPXA (e.g., in a plan view). In an embodiment, the auxiliary wiring EL and the pixel electrodes AE1, AE2, and AE3 may be disposed on different layers. However, the disclosure may not be limited thereto, and the auxiliary wiring EL and the pixel electrodes AE1, AE2, and AE3 may be disposed on a same layer.

The auxiliary wiring EL may have a line shape extending in the first direction DR1 or the second direction DR2, and may have a grid shape surrounding pixel electrodes constituting a pixel. The auxiliary wiring EL may not be limited to one embodiment and may have various shapes as long as it is able to provide the second voltage ELVSS (see FIG. 3B) to each of the pixels PXnm (see FIG. 3A).

The display panel DP may include an auxiliary electrode SE disposed on the base substrate BS (see FIG. 2) and electrically connected to the auxiliary wiring EL. In an embodiment, the auxiliary electrode SE and the auxiliary wiring EL may be disposed on different layers, and the auxiliary electrode SE may be connected to the auxiliary wiring EL through the contact hole. At least a portion of the auxiliary electrode SE may be exposed by an opening S-OP defined in the pixel defining layer PDL. The auxiliary electrode SE with the at least a portion exposed may be electrically connected to a common electrode of the light emitting element, and the second voltage ELVSS (see FIG. 3B) may be applied to the common electrode.

The auxiliary electrode SE and the pixel electrodes AE1, AE2, and AE3 may receive different voltages. In an embodiment, the pixel electrodes AE1, AE2, and AE3 may receive the first voltage ELVDD (see FIG. 3B), and the auxiliary electrode SE may receive the second voltage ELVSS (see FIG. 3B).

The auxiliary electrode SE may be disposed to be spaced apart from the pixel electrodes AE1, AE2, and AE3 in a plan view. In an embodiment, the auxiliary electrode SE and the pixel electrodes AE1, AE2, and AE3 may be disposed on a same layer and may be spaced apart from each other.

The auxiliary electrode SE may have an island shape spaced apart from the pixel electrodes AE1, AE2, and AE3. However, the disclosure may not be limited thereto, and similar to the auxiliary wiring EL, the auxiliary electrode SE may have a line shape extending in a direction. The auxiliary electrode SE shown in FIG. 4 is shown concisely for convenience of description. A shape and an area of the auxiliary electrode SE may vary depending on a design of the display panel DP.

The auxiliary electrode SE may be disposed to correspond to a pixel as shown in FIG. 4. However, the disclosure may not be limited thereto, and an auxiliary electrode SE may be disposed for the pixels or for each sub-pixel, and an arrangement of the auxiliary electrode SE may be varied.

Figure 5:
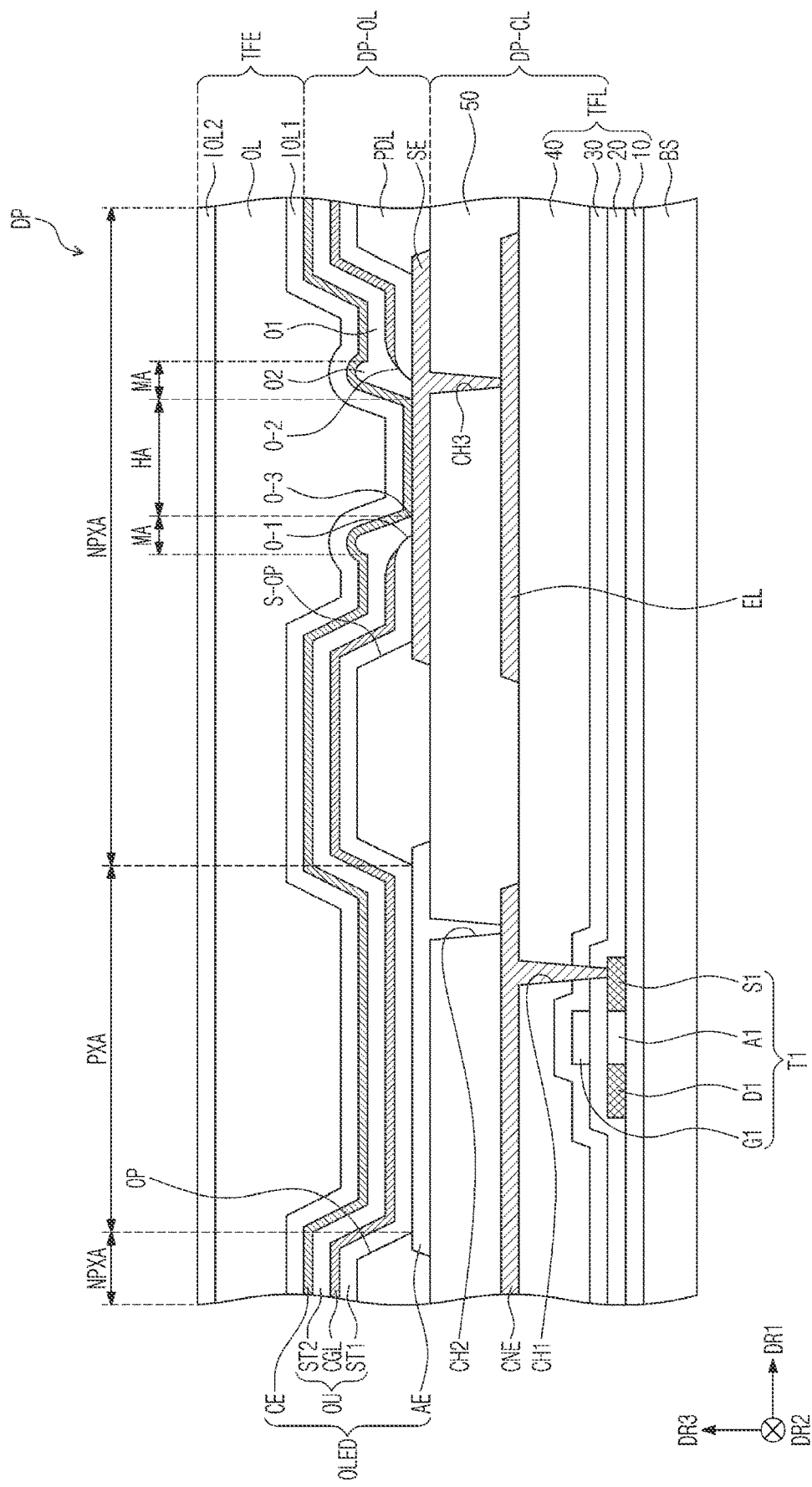
FIG. 5 is a schematic cross-sectional view of a display panel according to an embodiment of the disclosure.
Figure 6A:
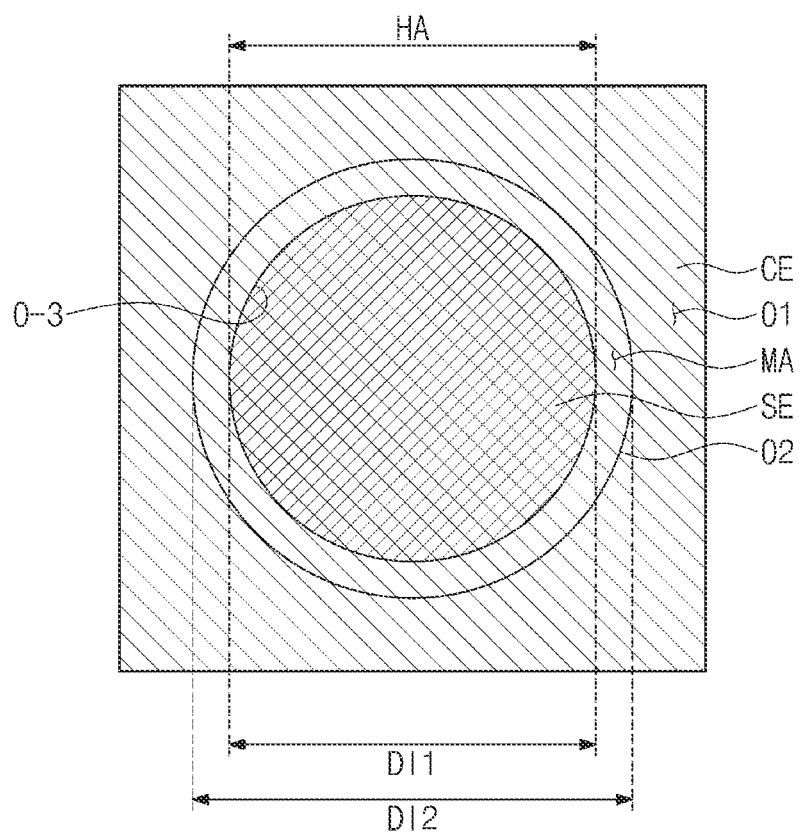
FIG. 6A is a schematic enlarged plan view of a display panel corresponding to an opening region according to an embodiment of the disclosure.
Figure 6B:
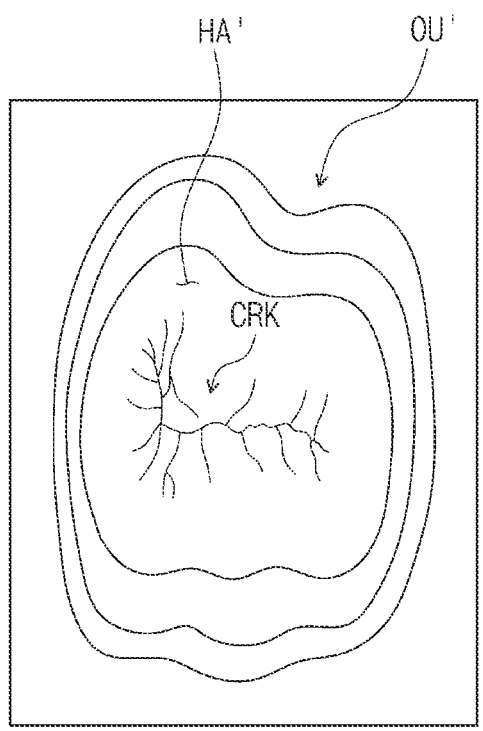
FIG. 6B is a schematic enlarged plan view of a display panel corresponding to an opening region according to Comparative Example.
Figure 7A:
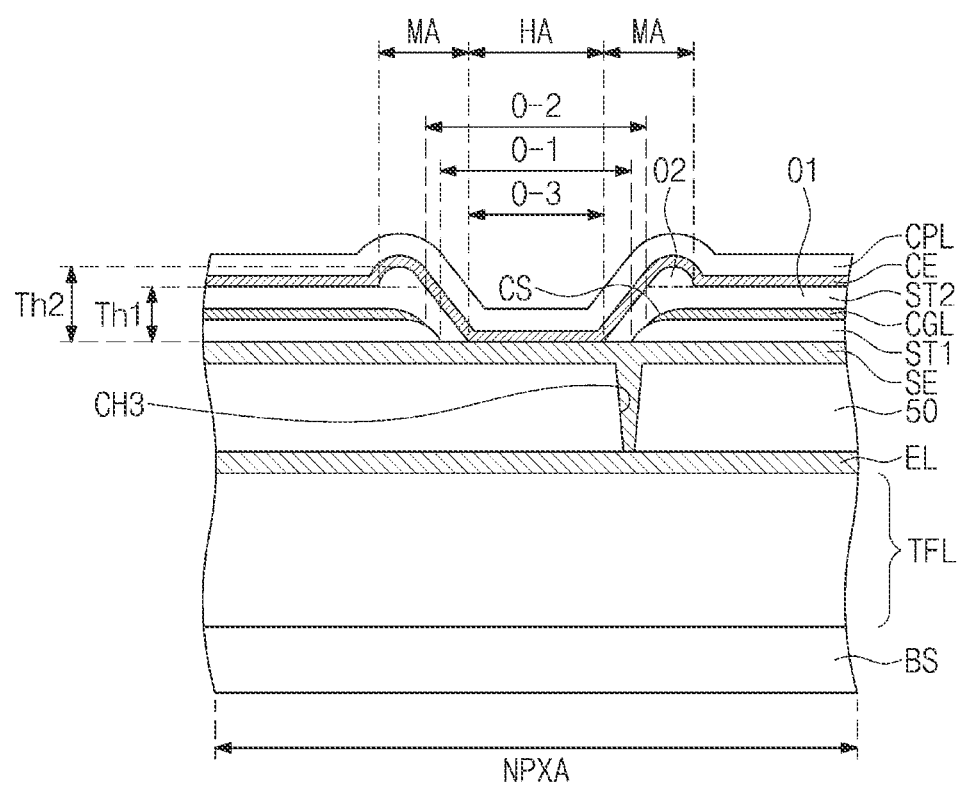
FIGS. 7A and 7B are schematic enlarged cross-sectional views of a display panel corresponding to an opening region according to an embodiment of the disclosure.
Figure 7A:
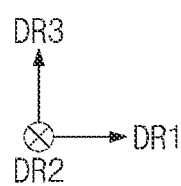
Figure 7B:
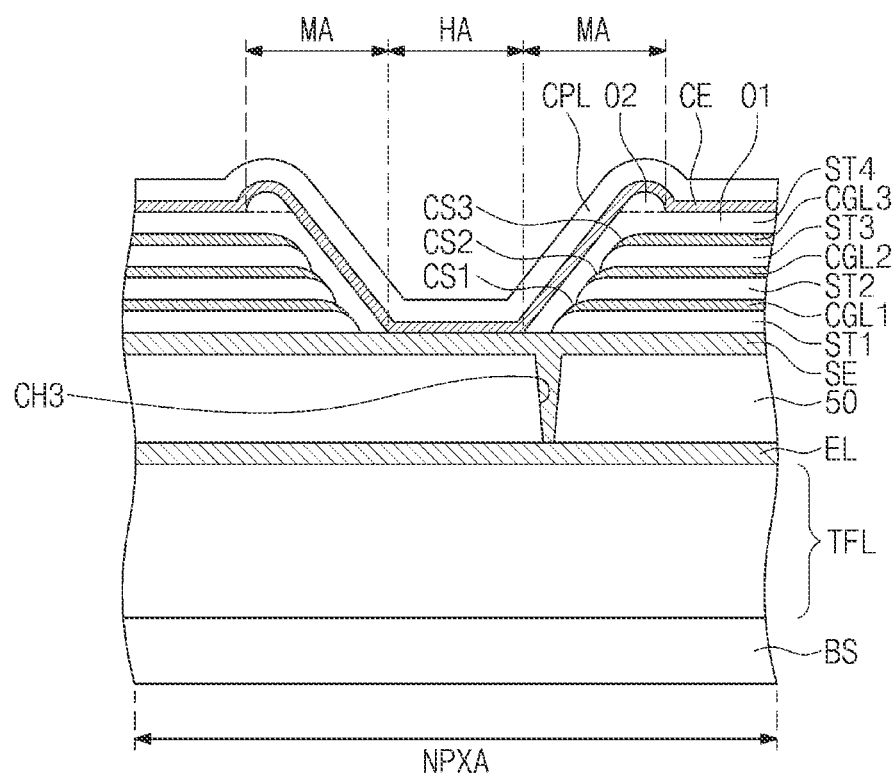

FIG. 5 is a schematic cross-sectional view of a display panel according to an embodiment of the disclosure. FIG. 6A is a schematic plan view of a display panel corresponding to a hole region according to an embodiment of the disclosure. FIG. 6B is a schematic plan view illustrating a hole region of a Comparative Example. FIGS. 7A and 7B are schematic cross-sectional views of a display panel corresponding to a hole region according to an embodiment of the disclosure.

The display panel DP may include the base substrate BS, the circuit layer DP-CL, the display element layer DP-OL, and the encapsulation layer TFE, and the above description may be applied thereto. FIG. 5 illustrates as an example a cross-section of the light emitting element OLED corresponding to a light emitting region PXA of the above-described light emitting regions and the auxiliary electrode SE adjacent to the light emitting element OLED.

The display panel DP may include an insulating layer, a semiconductor pattern, a conductive pattern, a signal line, and the like. In a manufacturing operation of the display panel DP, the insulating layer, a semiconductor layer, and a conductive layer may be formed on the base substrate BS by a process such as coating, deposition, and the like. Thereafter, the insulating layer, the semiconductor layer, and the conductive layer may be selectively patterned by a process of photolithography. By such a process, the semiconductor pattern, the conductive pattern, the signal line, and the like may be formed. The semiconductor pattern of the circuit layer DP-CL may be arranged in a rule (e.g., a predetermined or selected rule) over the pixels.

The base substrate BS may include a glass substrate, a metal substrate, a polymer substrate, or an organic/inorganic composite material substrate. The base substrate BS may have the single-layered or multi-layered structure. For example, the base substrate BS having the multi-layered structure may include synthetic resin layers and at least one inorganic layer disposed between the synthetic resin layers.

The synthetic resin layer of the base substrate BS may contain at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, a perylene-based resin, and a polyimide-based resin. However, the material of the synthetic resin layer of the base substrate BS is not limited to the above example.

At least one inorganic layer may be disposed on a top surface of the base substrate BS. The inorganic layer may constitute (or form) a barrier layer and/or a buffer layer. FIG. 5 illustrates as an example an inorganic layer defined as a buffer layer 10. The buffer layer 10 may improve a bonding force between the base substrate BS and the semiconductor pattern of the circuit layer DP-CL. The buffer layer 10 may contain at least one of aluminum oxide, titanium oxide, silicon oxide, silicon nitride, silicon oxynitride, zirconium oxide, and hafnium oxide, but may not be limited thereto.

The semiconductor pattern of the circuit layer DP-CL may be disposed on the buffer layer 10. The semiconductor pattern may contain metal oxide, polysilicon, or amorphous silicon.

The source S1, an active layer A1, and the drain D1 of the first transistor T1 may be formed from the semiconductor pattern. The semiconductor pattern of the first transistor T1 may be divided into regions depending on a degree of conductivity. For example, electrical properties of the semiconductor pattern may vary depending on whether the semiconductor pattern is doped or whether the metal oxide is reduced. A region having relatively high conductivity in the semiconductor pattern may serve as the electrode or the signal line, and may correspond to the source S1 or the drain D1 of the first transistor T1. A non-doped region, a doped region at a relatively low concentration, or a non-reduced region of the semiconductor pattern may have relatively low conductivity, and the corresponding region may correspond to the active layer A1 of the first transistor T1.

The circuit layer DP-CL may include the transistors and insulating layers constituting the pixel circuit PC (see FIG. 3B). FIG. 5 illustrates the first transistor T1 and first to fourth insulating layers 20, 30, 40, and 50.

The first to fourth insulating layers 20, 30, 40, and 50 may be disposed on the buffer layer 10. The first to fourth insulating layers 20, 30, 40, and 50 may include an inorganic layer or an organic layer, and may have the single-layered structure or the multi-layered structure.

The inorganic layer may contain at least one of aluminum oxide, titanium oxide, silicon oxide, silicon nitride, silicon oxynitride, zirconium oxide, and hafnium oxide, but may not be limited thereto. The organic layer may contain a phenol-based polymer, an acrylic polymer, an imide-based polymer, an arylether-based polymer, an amide-based polymer, a fluorine-based polymer, a p-xylene-based polymer, a vinyl alcohol-based polymer, and a polymer combining those, but may not be limited thereto.

The first insulating layer 20 may cover (or overlap, e.g., in a plan view) the semiconductor pattern of the circuit layer DP-CL. The gate G1 of the first transistor T1 may be disposed on the first insulating layer 20. The gate G1 may be a portion of the conductive pattern. The gate G1 may overlap the active layer A1. The gate G1 may function as a mask in the process of doping the semiconductor pattern. The second insulating layer 30 may be disposed on the first insulating layer 20 and may cover the gate G1. The third insulating layer 40 may be disposed on the second insulating layer 30.

In an example, a layer including the buffer layer 10, the first to third insulating layers 20, 30, and 40, and transistors (e.g., the first transistor T1 in FIG. 5) formed between the insulating layers may be defined as a transistor layer TFL.

A connection electrode CNE may be disposed between the first transistor T1 and the light emitting element OLED to connect the first transistor T1 and the light emitting device OLED to each other. The connection electrode CNE may be disposed on the third insulating layer 40, and may be connected to the source S1 of the first transistor T1 through a first contact hole CH1 penetrating the first and second insulating layers 20 and 30.

The auxiliary wiring EL may be disposed on the third insulating layer 40. In an embodiment, the auxiliary wiring EL and the connection electrode CNE may be disposed on a same layer. The auxiliary wiring EL may be electrically connected to a power line provided with the second voltage ELVSS (see FIG. 3B).

The fourth insulating layer 50 may be disposed on the third insulating layer 40. The fourth insulating layer 50 may cover the connection electrode CNE and the auxiliary wiring EL. In an embodiment, the fourth insulating layer 50 may include an organic layer. The fourth insulating layer 50 including the organic layer may provide a flat top surface. However, an embodiment is not limited thereto.

The display element layer DP-OL may be disposed on the circuit layer DP-CL. The display element layer DP-OL may include the light emitting elements and the pixel defining layer PDL. FIG. 5 illustrates as an example a cross-section corresponding to a light emitting element OLED. The light emitting element OLED may include a first electrode AE (or a pixel electrode), a light emitting stack OU, and a second electrode CE (or a common electrode). The first electrode AE may correspond to one of the pixel electrodes AE1, AE2, and AE3 described above with reference to FIG. 4.

The first electrode AE may be disposed in a first region on the base substrate BS. In an embodiment, the first electrode AE may be disposed on the fourth insulating layer 50 of the circuit layer DP-CL. The first electrode AE may be connected to the connection electrode CNE through a second contact hole CH2 penetrating the fourth insulating layer 50. The first electrode AE may be connected to the first transistor T1 through the connection electrode CNE.

The pixel defining layer PDL may be disposed on the fourth insulating layer 50. The pixel defining layer PDL may cover a portion of a top surface of the first electrode AE. In the pixel defining layer PDL, a light emitting opening OP exposing a portion of the first electrode AE may be defined. The portion of the first electrode AE exposed by the light emitting opening OP of the pixel defining layer PDL may correspond to a light emitting region PXA.

The pixel defining layer PDL may contain an organic material. For example, the pixel defining layer PDL may contain a polyacrylate-based resin or the polyimide-based resin, but the material of the pixel defining layer PDL may not be limited thereto. In an example, the pixel defining layer PDL may contain an inorganic material. For example, the pixel defining layer PDL may contain silicon nitride ($SiN_x$), silicon oxide ($SiO_x$), silicon oxynitride ($SiO_xN_y$), and the like, but the material of the pixel defining layer PDL may not be limited to the above example.

The pixel defining layer PDL may contain a light absorbing material or may have a color. For example, the pixel defining layer PDL may contain a base resin and a black pigment and/or a black dye mixed with the base resin.

The light emitting stack OU may include organic layers ST1 and ST2 and a charge generation layer CGL disposed between the first electrode AE and the second electrode CE facing from each other. Each of the organic layers ST1 and ST2 may be defined as stacks. Accordingly, in the specification, the organic layers ST1 and ST2 of the light emitting element OLED may be referred to as stacks ST1 and ST2. Each of the stacks ST1 and ST2 may include functional layers containing a hole transport material or an electron transport material, and a light emitting layer containing a light emitting material. Accordingly, the light emitting element OLED of an embodiment may be a light emitting element having a tandem structure including light emitting layers.

Each of the first organic layer ST1 and the second organic layer ST2 may include the light emitting layer. The light emitting layer of the first organic layer ST1 and the light emitting layer of the second organic layer ST2 may overlap each other. A color of light generated from the light emitting layer of the first organic layer ST1 may be substantially the same as a color of light generated from the light emitting layer of the second organic layer ST2. For example, the light emitting layer of the first organic layer ST1 and the light emitting layer of the second organic layer ST2 may generate blue light. However, the disclosure may not be limited thereto, and the color of light generated from the light emitting layer of the first organic layer ST1 may be different from the color of light generated from the light emitting layer of the second organic layer ST2. For example, the light emitting layer of the first organic layer ST1 may generate the blue light, and the light emitting layer of the second organic layer ST2 may generate green light. However, the color of light generated by the light emitting layers of the light emitting stack OU is not limited to the above example.

The charge generation layer CGL may be disposed between the organic layers ST1 and ST2 (or the stacks). Referring to FIG. 5, the charge generation layer CGL may be disposed between the first organic layer ST1 and the second organic layer ST2.

The charge generation layer CGL may generate charges (electrons and holes) by forming a complex through an oxidation-reduction reaction in case that a voltage is applied. Thereafter, the charge generation layer CGL may provide the generated charges to each of the adjacent stacks ST1 and ST2. The charge generation layer CGL may multiply efficiency of a current generated in the adjacent stacks ST1 and ST2, and may serve to adjust a balance of the charges between the adjacent stacks ST1 and ST2.

The charge generation layer CGL may include an n-type layer and/or a p-type layer. In an embodiment, the charge generation layer CGL may have a structure in which the n-type layer and the p-type layer are bonded to each other. However, the disclosure may not be limited thereto, and the charge generation layer CGL may include only one of the n-type layer and the p-type layer. The n-type layer may be a charge generation layer that provides the electrons to the adjacent stack. The n-type layer may be a layer in which a base material is doped with an n-dopant. The p-type layer may be a charge generation layer that provides the holes to the adjacent stack.

In an embodiment, a thickness of the charge generation layer CGL may be equal to or greater than about 1 Å and equal to or smaller than about 150 Å (angstrom). A concentration of the n-dopant doped in the charge generation layer CGL may be in a range equal to or greater than about 0.1% and equal to or smaller than about 3%, and specifically may be in a range equal to or smaller than about 1%. In case that the concentration is smaller than about 0.1%, an effect of the charge generation layer CGL of adjusting the balance of the charges may hardly occur. In case that the concentration is greater than about 3%, a light efficiency of the light emitting element OLED may be reduced.

The charge generation layer CGL may contain a charge generating compound composed of an arylamine-based organic compound, a metal, a metal oxide, a carbide, a fluoride, or a mixture thereof. For example, the arylamine-based organic compound may include α-NPD, 2-TNATA, TDATA, MTDATA, sprio-TAD, or sprio-NPB. The metal may include cesium (Cs), molybdenum (Mo), vanadium (V), titanium (Ti), tungsten (W), barium (Ba), or lithium (Li). The metal oxide, the carbide, and the fluoride may include $Re_2O_7$, $MoO_3$, $V_2O_5$, $WO_3$, $TiO_2$, $Cs_2CO_3$, BaF, LiF, or CsF. However, the material of the charge generation layer CGL is not limited to the above example.

The second electrode CE may face the first electrode AE, and may be disposed on the light emitting stack OU. The second electrode CE may be a common layer provided common to the pixels, and may overlap the light emitting region PXA and the non-light emitting region NPXA. A common voltage may be provided to the second electrode CE.

The second electrode CE may be formed to have light transmittance. The second electrode CE may be a transflective electrode or a transmissive electrode. In case that the second electrode CE is provided as the transmissive electrode, the second electrode CE may contain a transparent metal oxide, for example, indium tin oxide (ITO), indium zinc oxide (IZO), zinc oxide (ZnO), or indium tin zinc oxide (ITZO). In case that the second electrode CE is provided as the transflective electrode or a reflective electrode, the second electrode CE may contain Ag, Mg, Cu, Al, Pt, Pd, Au, Ni, Nd, Ir, Cr, Li, Ca, LiF/Ca, LiF/Al, Mo, Ti, Yb, W, In, Zn, Sn, or a compound or a mixture (e.g., AgMg, AgYb, or MgAg) containing those. However, the disclosure may not be limited thereto, and the second electrode CE may have the multi-layered structure including a reflective or transflective film made of the above material and a transparent conductive film made of the indium tin oxide (ITO), the indium zinc oxide (IZO), the zinc oxide (ZnO), the indium tin zinc oxide (ITZO), or the like.

The second electrode CE may be formed by being thinly deposited to transmit a light. For example, a thickness of the second electrode CE may be equal to or smaller than about 100 Å. However, the thickness of the second electrode CE is not limited to the above example.

The auxiliary electrode SE may be disposed in a second region on the base substrate BS. In an embodiment, the auxiliary electrode SE may be disposed on the fourth insulating layer 50 of the circuit layer DP-CL. The auxiliary electrode SE may be connected to the auxiliary wiring EL through a third contact hole CH3 penetrating the fourth insulating layer 50. The auxiliary electrode SE may receive the second voltage through the auxiliary wiring EL. However, the disclosure may not be limited thereto, and the auxiliary electrode SE may be directly connected to the power line providing the second voltage and receive the second voltage.

The auxiliary electrode SE and the first electrode AE may be disposed on a same layer. The auxiliary electrode SE may have the island shape spaced apart from the first electrode AE in a plan view. However, the disclosure may not be limited thereto, and the auxiliary electrode SE may have the line shape extending in a direction in a plan view. The auxiliary electrode SE may have a different shape(s) as long as it is spaced apart from the first electrode AE.

The organic layers ST1 and ST2 and the charge generation layer CGL may be provided common to the pixels, and may overlap the light emitting region PXA and the non-light emitting region NPXA. Accordingly, a portion of each of the organic layers ST1 and ST2 and the charge generation layer CGL may be disposed on the pixel defining layer PDL.

In an embodiment, the functional layers and the light emitting layers included in the organic layers ST1 and ST2 may overlap the light emitting region PXA and the non-light emitting region NPXA and may be provided as a common layer having an integral shape. However, the disclosure may not be limited thereto, and some of the functional layers and the light emitting layers included in the organic layers ST1 and ST2 may be patterned and provided inside the light emitting opening OP defined in the pixel defining layer PDL. For example, at least some of the functional layers and the light emitting layers included in the organic layers ST1 and ST2 may be patterned by a method such as inkjet printing and be provided inside the light emitting opening OP of the pixel defining layer PDL to overlap the light emitting region PXA.

The portion of each of the organic layers ST1 and ST2 and the charge generation layer CGL may overlap the auxiliary electrode SE in a plan view. The opening S-OP exposing a portion of the auxiliary electrode SE may be defined in the pixel defining layer PDL, and the portion of each of the organic layers ST1 and ST2 and the charge generation layer CGL may be disposed in the opening S-OP of the pixel defining layer PDL overlapping the auxiliary electrode SE. Accordingly, the portion of each of the organic layers ST1 and ST2 and the charge generation layer CGL may be disposed between the auxiliary electrode SE and the second electrode CE in a thickness direction of the display panel DP.

A hole penetrating the organic layers ST1 and ST2 (or the stacks) and the charge generation layer CGL and exposing a portion of the auxiliary electrode SE may be defined in the light emitting stack OU. The portion of the auxiliary electrode SE exposed by the hole of the light emitting stack OU may be defined as a hole region HA. The second electrode CE may be electrically connected to the auxiliary electrode SE through the hole region HA of the light emitting stack OU.

In order for light generated from the light emitting stack OU to pass through the second electrode CE and be emitted toward the display surface IS (see FIG. 1A), the second electrode CE may be provided as an electrode having relatively high light transmittance. For example, the second electrode CE may be provided as a transparent electrode or as an electrode having a small thickness. In this case, a resistance of the second electrode CE is increased, so that an IR drop phenomenon may occur. However, as the second electrode CE contacts the auxiliary electrode SE, the resistance of the second electrode CE may be reduced and the IR drop phenomenon may be prevented.

The encapsulation layer TFE may be disposed on the display element layer DP-OL to seal the light emitting element OLED. The encapsulation layer TFE may include an inorganic film and an organic film. FIG. 5 illustrates as an example an embodiment of the encapsulation layer TFE including first and second inorganic films IOL1 and IOL2 and an organic film OL disposed between the first and second inorganic films IOL1 and IOL2. The first inorganic film IOL1 may be disposed on the second electrode CE, and the organic film OL and the second inorganic film IOL2 may be sequentially disposed on the first inorganic film IOL1.

The first and second inorganic films IOL1 and IOL2 may protect the light emitting element OLED from the moisture and/or oxygen. The first and second inorganic films IOL1 and IOL2 may contain at least one of aluminum oxide, titanium oxide, silicon oxide, silicon nitride, silicon oxynitride, zirconium oxide, and hafnium oxide, but may not be limited thereto.

The organic film OL may protect the light emitting element OLED from the foreign substances such as dust particles. The organic film OL may contain an acrylic resin, but may not be limited thereto.

Each of the organic layers ST1 and ST2 (or the stacks) and the charge generation layer CGL included in the light emitting stack OU of the disclosure may include an opening region overlapping the auxiliary electrode SE. The first organic layer ST1 may include a first opening region O-1 defined through the first organic layer ST1 in the region overlapping the auxiliary electrode SE. The charge generation layer CGL may include a second opening region O-2 defined through the charge generation layer CGL in the region overlapping the auxiliary electrode SE. The second organic layer ST2 may include a third opening region O-3 defined through the second organic layer ST2 in the region overlapping the auxiliary electrode SE. In an example, herein, the terms first, second, and third are used only to distinguish the opening regions included in the respective layers, and the opening regions included in the respective layers are not limited to such terms.

The first to third opening regions O-1, O-2, and O-3 may overlap each other on the auxiliary electrode SE, and may form a hole region HA exposing the portion of the auxiliary electrode SE. Accordingly, the second electrode CE may be electrically connected to the auxiliary electrode SE through the first to third opening regions O-1, O-2, and O-3. An opening region with the smallest planar area among the first to third opening regions O-1, O-2, and O-3 may define the hole region HA of the light emitting stack OU. Hereinafter, this will be described in detail with reference to FIGS. 6A and 7A.

FIG. 6A is a schematic plan view of the auxiliary electrode SE and the second electrode CE contacting (or in contact with) each other through the hole region HA. FIG. 7A schematically illustrates some components of the display panel DP corresponding to the hole region HA while omitting the components of the encapsulation layer TFE and the transistor layer TFL in FIG. 5.

Referring to FIGS. 5, 6A, and 7A, among the organic layers ST1 and ST2 included in the light emitting stack OU, a planar area of the third opening region O-3 of the second organic layer ST2 disposed closest to the second electrode CE may be the smallest among planar areas of the first to third opening regions O-1, O-2, and O-3. Therefore, the planar area of the third opening region O-3 of the second organic layer ST2 may define the planar area of the hole region HA of the light emitting stack OU. Boundaries of the first opening region O-1 of the first organic layer ST1 and the second opening region O-2 of the charge generation layer CGL may be formed outwardly of a boundary of the third opening region O-3 of the second organic layer ST2 in a plan view, and may be covered by the second organic layer ST2.

The organic layer disposed at an upper portion of the light emitting stack OU may further include a protrusion. Referring to FIGS. 5, 6A, and 7A, the second organic layer ST2 (or a second stack) of the light emitting stack OU may include a first portion O1 overlapping the portion of the auxiliary electrode SE and having a flat top surface, and a second portion O2 protruding from the first portion O1 toward the encapsulation layer TFE. Hereinafter, the second portion O2 may be defined as the protrusion O2.

The protrusion O2 may be formed adjacent to the third opening region O-3 of the second organic layer ST2. The protrusion O2 may surround the third opening region O-3 in a plan view. A region from an edge of the third opening region O-3 to an edge of the protrusion O2 in a plan view may be defined as a protrusion region MA. The protrusion region MA may surround the hole region HA in a plan view.

Referring to FIG. 6A, the third opening region O-3 may have a circular shape in a plan view, and the protrusion O2 may surround the circular third opening region O-3. For example, the protrusion O2 surrounding the circular third opening region O-3 may have a circular annular shape in a plan view. However, the shape in a plan view of the protrusion O2 is not limited to the illustrated embodiment, and the protrusion O2 may have various shapes corresponding to the shape of the third opening region O-3.

The third opening region O-3 and the protrusion region MA surrounding the third opening region O-3 may be regions having diameters. For example, the third opening region O-3 may be a circular region having a first diameter DI1. An edge of the protrusion region MA may correspond to a circle having a second diameter DI2. For example, a distance between edges of the protrusion O2 passing through a center of the third opening region O-3 may correspond to the second diameter DI2.

The second diameter DI2 may be greater than the first diameter DI1. For example, the second diameter DI2 may be equal to or greater than about 1.2 times and equal to or smaller than about 1.4 times the first diameter DI1. However, a numerical relationship between the first diameter DI1 and the second diameter DI2 is not limited to the above example. Shapes and areas of the opening region of the second organic layer ST2 and the protrusion O2 in a plan view may vary depending on conditions such as an intensity, a phase, and the like of a laser forming the opening region.

The hole region HA of the light emitting stack OU of the disclosure may be formed by a laser with improved uniformity of energy intensity. The hole region HA formed by the laser with the improved uniformity of the energy intensity may have a circular shape having a substantially uniform diameter in a plan view. In addition, in case that the laser is used, it is easy to remove components of the light emitting stack OU that need to be removed in response to the hole region HA as needed, and the second electrode CE may be deposited on the hole region HA without a damaged portion.

FIG. 6B illustrates as an example a schematic plan view of a light emitting stack OU' corresponding to a hole region HA' of Comparative Example. Comparative Example shown in FIG. 6B may correspond to the hole region HA' formed by a laser whose uniformity of the energy intensity is lowered. The laser with the lowered uniformity of the energy intensity may not sufficiently remove components of the light emitting stack OU' that need to be removed. Accordingly, the hole region HA' having a non-uniform shape may be formed, and cracks CRK may occur in some components of the light emitting stack OU' in the process of forming the hole region HA'. Therefore, the second electrode deposited on the hole region HA' of Comparative Example may be damaged or may come into contact with a charge generation layer of the light emitting stack OU', and reliability of the display panel may be deteriorated because of the damage and a leakage current.

Referring again to FIGS. 5 and 7A, the protrusion O2 may include a curved surface in a cross-sectional view. In an embodiment, the curved surface of the protrusion O2 may be formed to overlap the protrusion region MA. By the protrusion O2, a thickness of the portion of the light emitting stack OU overlapping the auxiliary electrode SE may be greater than a thickness of the light emitting stack OU overlapping the first electrode AE.

Referring to FIG. 7A, the second organic layer ST2 may include the first portion O1 with the flat top surface on the auxiliary electrode SE, and the protrusion O2 protruding from the first portion O1 in the third direction DR3. The light emitting stack OU may have a first thickness Th1 in a region that does not overlap the hole region HA and the protrusion region MA. A portion of the light emitting stack OU on which the protrusion O2 is formed may have a second thickness Th2 in the protrusion region MA.

The first thickness Th1 may correspond to a sum of thicknesses of the components of the light emitting stack OU in the region that does not overlap the hole region HA and the protrusion region MA. Based on the embodiment in FIG. 7A, the first thickness Th1 may be a sum of thicknesses of the first organic layer ST1, the charge generation layer CGL, and the second organic layer ST2. For example, the first thickness Th1 may correspond to a distance (or separation distance) from a bottom surface of the first organic layer ST1 to a top surface of the first portion O1 of the second organic layer ST2 in the third direction DR3.

The second thickness Th2 may be a sum of the first thickness Th1 and a thickness of the protrusion O2. The second thickness Th2 may correspond to a distance from the bottom surface of the first organic layer ST1 to the most protruding point on the top surface of the protrusion O2 in the third direction DR3.

The second thickness Th2 may be greater than the first thickness Th1. For example, the second thickness Th2 may be equal to or greater than about 1.3 times and equal to or smaller than about 1.5 times the first thickness Th1. However, a numerical relationship between the first thickness Th1 and the second thickness Th2 is not limited to the above example. The thickness of the light emitting stack OU adjacent to the hole region HA may vary depending on conditions such as an intensity, a phase, and the like of a laser forming the hole region HA.

The second organic layer ST2 may cover a cross-section of the first organic layer ST1 exposed by the first opening region O-1 and a cross-section of the charge generation layer CGL exposed by the second opening region O-2. A width of a cross-section of the second organic layer ST2 exposed by the third opening region O-3 may become smaller as it approaches the auxiliary electrode SE. For example, the cross-section of the second organic layer ST2 defining the third opening region O-3 may be an inclined surface, or the second organic layer ST2 may have an inversely tapered shape. However, the shape of the second organic layer ST2 in which the third opening region O-3 is formed is not limited thereto.

The first to third opening regions O-1, O-2, and O-3 may be formed by a laser drilling process to be described below. In the process of defining the first to third opening regions O-1, O-2, and O-3, the organic layers of the light emitting stack OU may be pushed outwardly of the first to third opening regions O-1, O-2, and O-3 by the laser. In such a process, the protrusion O2 may be formed in the light emitting stack OU.

A portion of the charge generation layer CGL overlapping the auxiliary electrode SE may include a curved surface CS in a cross-sectional view. Specifically, a side of the charge generation layer CGL corresponding to the boundary of the second opening region O-2 may include the curved surface CS. For example, the curved surface CS may be formed adjacent to the second opening region O-2. In an embodiment, the curved surface CS may surround the second opening region O-2. The curved surface CS at the side of the charge generation layer CGL may be formed by being bent downward from a flat top surface of the charge generation layer CGL.

In the process of forming the first to third opening regions O-1, O-2, and O-3, the organic layers ST1 and ST2 disposed to overlap the charge generation layer CGL may be pushed outwardly of the hole region HA by the laser. In such a process, the second organic layer ST2 disposed on the charge generation layer CGL may push the charge generation layer CGL containing a material different from that of the second organic layer ST2 outwardly of the third opening region O-3. Accordingly, the inner side of the charge generation layer CGL corresponding to the boundary of the second opening region O-2 may be bent. In addition, the second organic layer ST2 may cover the inner side of the charge generation layer CGL defining the boundary of the second opening region O-2 while pushing the charge generation layer CGL.

The inner side of the charge generation layer CGL including the curved surface CS may be spaced apart from the second electrode CE disposed in the first to third opening regions O-1, O-2, and O-3. Specifically, the inner side of the charge generation layer CGL may be covered by the second organic layer ST2, and the charge generation layer CGL may be spaced apart from the second electrode CE with the second organic layer ST2 interposed therebetween.

The curved surface CS of the charge generation layer CGL may be within the protrusion region MA. In an embodiment, the protrusion O2 of the second organic layer ST2 may overlap the curved surface CS of the charge generation layer CGL and cover the curved surface CS of the charge generation layer CGL. The protrusion O2 may be formed between the charge generation layer CGL and the second electrode CE to prevent contact between the charge generation layer CGL and the second electrode CE.

The charge generation layer CGL and the second electrode CE may be insulated from each other by being spaced apart from each other. Accordingly, it is possible to prevent occurrence of a leakage current resulting from the contact between the charge generation layer CGL and the second electrode CE. In case that the second electrode contacts the charge generation layer and the leakage current occurs, a phenomenon in which a portion of the pixels emits light more brightly may occur. However, the display panel DP of an embodiment of the disclosure may emit light with uniform luminance as the charge generation layer CGL and the second electrode CE are spaced apart from each other.

In an example, referring to FIG. 7A, the display panel DP may further include a capping layer CPL disposed on the second electrode CE. The capping layer CPL may have a single-layered or multi-layered structure. The capping layer CPL may include an organic layer or an inorganic layer. For example, the inorganic layer of the capping layer CPL may contain at least one of an alkali metal compound such as LiF, an alkaline earth metal compound such as $MgF_2$, silicon nitride, silicon oxynitride, and silicon oxide. The organic layer of the capping layer CPL may contain α-NPD, NPB, TPD, m-MTDATA, $Alq_3$, CuPc, TCTA, an epoxy resin, or an acrylate-based resin. However, the material of the capping layer CPL is not limited to the above example.

The light emitting stack OU of the disclosure may not be limited to that shown in FIG. 7A, and may include charge generation layers disposed between the stacks. Referring to FIG. 7B, the light emitting stack OU may include first to fourth stacks ST1, ST2, ST3, and ST4 (or first to fourth organic layers) and first to third charge generation layers CGL1, CGL2, and CGL3 disposed between the stacks. The embodiment shown in FIG. 7B and the embodiment shown in FIG. 7A may include substantially the same or similar components, and may be different from each other at least in the components of the light emitting stack OU. Hereinafter, the embodiment of FIG. 7B will be described focusing on the differences.

Referring to FIG. 7B, each of the first to fourth stacks ST1, ST2, ST3, and ST4 may include functional layers containing a hole transport material or an electron transport material, and a light emitting layer containing a light emitting material.

The first charge generation layer CGL1 may be disposed between the first stack ST1 (or a first organic layer) and the second stack ST2 (or a second organic layer). The second charge generation layer CGL2 may be disposed between the second stack ST2 and the third stack ST3 (or a third organic layer). The third charge generation layer CGL3 may be disposed between the third stack ST3 and the fourth stack ST4 (or a fourth organic layer). The description of the charge generation layer CGL may be applied to descriptions of the first to third charge generation layers CGL1, CGL2, and CGL3.

Each of the first to third charge generation layers CGL1, CGL2, and CGL3 may be spaced apart from the second electrode CE. Each of the first to third charge generation layers CGL1, CGL2, and CGL3 may include an opening region, and inner surfaces (or inner sides) of the first to third charge generation layers CGL1, CGL2, and CGL3 corresponding to a boundary of each of the opening regions may be bent and include curved surfaces CS1, CS2, and CS3, respectively. For this reason, each of the first to third charge generation layers CGL1, CGL2, and CGL3 may be spaced apart from the second electrode CE and may be electrically insulated from the second electrode CE.

The curved surfaces CS1, CS2, and CS3 of the first to third charge generation layers CGL1, CGL2, and CGL3 may overlap the fourth organic layer ST4 in the protrusion region MA. The curved surfaces CS1, CS2, and CS3 of the first to third charge generation layers CGL1, CGL2, and CGL3 may be covered by the fourth organic layer ST4. Accordingly, each of the inner surfaces of the first to third charge generation layers CGL1, CGL2, and CGL3 may be spaced apart from the second electrode CE with the fourth organic layer ST4 disposed at the uppermost portion of the light emitting stack OU interposed (or disposed) therebetween.

The fourth organic layer ST4 disposed at the uppermost portion of the light emitting stack OU may include the first portion O1 having the flat top surface and the protrusion O2 protruding from the first portion O1. The protrusion O2 of the fourth organic layer ST4 may be formed between the second electrode CE and the third charge generation layer CGL3 to space the third charge generation layer CGL3 and the second electrode CE apart from each other. Accordingly, it is possible to prevent a leakage current resulting from the contact between the first to third charge generation layers CGL1, CGL2, and CGL3 and the second electrode CE, and the display panel DP may emit the light with the uniform luminance.

Even in the embodiment in FIG. 7B, the above-described description may be applied to descriptions of a thickness of the light emitting stack and planar areas of the hole region HA and the protrusion region MA.

Figure 8:
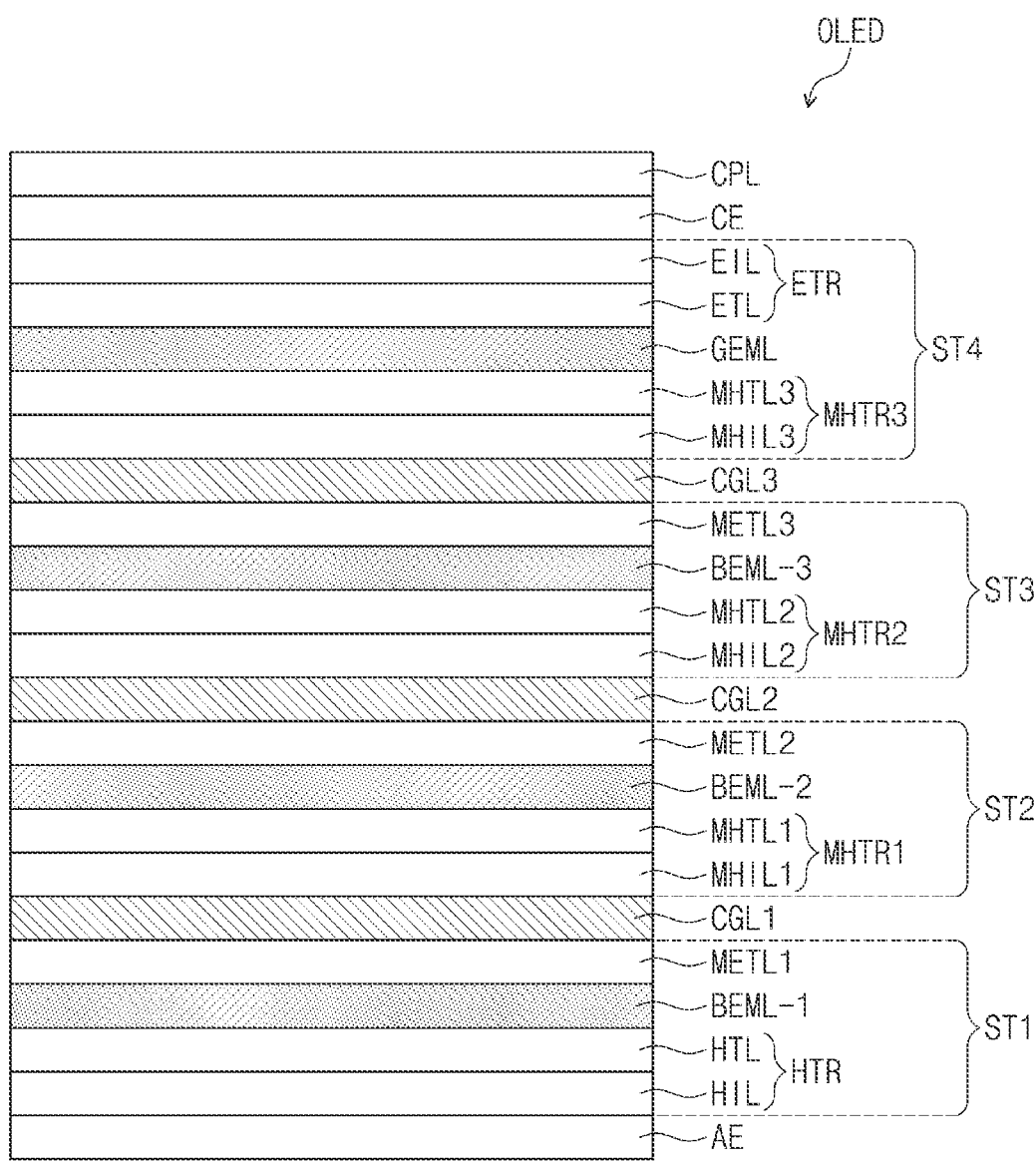
FIG. 8 is a schematic cross-sectional view schematically illustrating a stacked structure of a light emitting element according to an embodiment of the disclosure.

FIG. 8 is a schematic cross-sectional view schematically illustrating a stacked structure of a light emitting element according to an embodiment of the disclosure.

Referring to FIG. 8, the light emitting element OLED of an embodiment may include the first electrode AE, the second electrode CE facing away from the first electrode AE, and the first to fourth stacks ST1, ST2, ST3, and ST4 disposed between the first electrode AE and the second electrode CE. In an example, FIG. 8 illustrates that the light emitting element OLED includes the four stacks, but the number of stacks included in the light emitting element OLED may be less or more than four.

The light emitting element OLED may include the first to third charge generation layers CGL1, CGL2, and CGL3 disposed between the first to fourth stacks ST1, ST2, ST3, and ST4. The above description may be applied to the description of the first to third charge generation layers CGL1, CGL2, and CGL3.

Each of the first to fourth stacks ST1, ST2, ST3, and ST4 may include a light emitting layer. The first stack ST1 may include a first light emitting layer BEML-1, and the second stack ST2 may include a second light emitting layer BEML-2, the third stack ST3 may include a third light emitting layer BEML-3, and the fourth stack ST4 may include a fourth light emitting layer GEML. Some of the light emitting layers included in the first to fourth stacks ST1, ST2, ST3, and ST4 may emit light of substantially a same color, and some may emit light of colors different from each other. However, the disclosure may not be limited thereto, and all of the light emitting layers included in the first to fourth stacks ST1, ST2, ST3, and ST4 may emit light of substantially a same color.

In an embodiment, the first to third light emitting layers BEML-1, BEML-2, and BEML-3 of the first to third stacks ST1, ST2, and ST3 may emit the light of substantially a same first color. For example, the first color light may be the blue light. A wavelength range of the light emitted from the first to third light emitting layers BEML-1, BEML-2, and BEML-3 may be equal to or greater than about 420 nm and equal to or smaller than about 480 nm.

The fourth light emitting layer GEML of the fourth stack ST4 may emit the second color light different from the first color light. For example, the second color light may be the green light. The wavelength range of the light emitted from the fourth light emitting layer GEML may be equal to or greater than about 520 nm and equal to or smaller than about 600 nm.

At least some of the first to fourth light emitting layers BEML-1, BEML-2, BEML-3, and GEML may have a structure of two layers containing different host materials. For example, in the two-layered structure, a layer may contain a hole transport host material, and the other layer may include an electron transport host material. The electron transport host material may be a material containing an electron transporting moiety in a molecular structure.

The first stack ST1 may include a hole transport region HTR that transports holes provided from the first electrode AE to the first light emitting layer BEML-1, and a first intermediate electron transport region METL1 that transports electrons generated from the first charge generation layer CGL1 to the first light emitting layer BEML-1.

The hole transport region HTR may include a hole injection layer HIL disposed on the first electrode AE, and a hole transport layer HTL disposed on the hole injection layer HIL. However, the disclosure may not be limited thereto, and the hole transport region HTR may further include at least one of a hole buffer layer, a light emitting auxiliary layer, and an electron blocking layer. The hole buffer layer may be a layer that increases a light emission efficiency by compensating for a resonance distance based on a wavelength of light emitted from the light emitting layer. The electron blocking layer may be a layer serving to prevent electron injection from the electron transport region into the hole transport region.

The first intermediate electron transport region METL1 may include a first intermediate electron transport layer disposed on the first light emitting layer BEML-1. However, the disclosure may not be limited thereto, and the first intermediate electron transport region METL1 may further include at least one of an electron buffer layer and a hole blocking layer.

The second stack ST2 may include a first intermediate hole transport region MHTR1 that transports holes generated from the first charge generation layer CGL1 to the second light emitting layer BEML-2, and a second intermediate electron transport region METL2 that transports electrons provided from the second charge generation layer CGL2 to the second light emitting layer BEML-2.

The first intermediate hole transport region MHTR1 may include a first intermediate hole injection layer MHIL1 disposed on the first charge generation layer CGL1, and a first intermediate hole transport layer MHTL1 disposed on the first intermediate hole injection layer MHIL1. The first intermediate hole transport region MHTR1 may further include at least one of the hole buffer layer, the light emitting auxiliary layer, and the electron blocking layer disposed on the first intermediate hole transport layer MHTL1.

The second intermediate electron transport region METL2 may include a second intermediate electron transport layer disposed on the second light emitting layer BEML-2. However, the disclosure may not be limited thereto, and the second intermediate electron transport region METL2 may further include at least one of the electron buffer layer and the hole blocking layer disposed between the second intermediate electron transport layer and the second light emitting layer BEML-2.

The third stack ST3 may include a second intermediate hole transport region MHTR2 that transports holes, generated from the second charge generation layer CGL2, to the third light emitting layer BEML-3, and a third intermediate electron transport region METL3 that transports electrons, provided from the third charge generation layer CGL3, to the third light emitting layer BEML-3.

The second intermediate hole transport region MHTR2 may include a second intermediate hole injection layer MHIL2 disposed on the second charge generation layer CGL2, and a second intermediate hole transport layer MHTL2 disposed on the second intermediate hole injection layer MHIL2. However, the disclosure may not be limited thereto, and the second intermediate hole transport region MHTR2 may further include at least one of the hole buffer layer, the light emitting auxiliary layer, and the electron blocking layer disposed on the second intermediate hole transport layer MHTL2.

The third intermediate electron transport region METL3 may include a third intermediate electron transport layer disposed on the third light emitting layer BEML-3. However, the disclosure may not be limited thereto, and the third intermediate electron transport region METL3 may further include at least one of the electron buffer layer and the hole blocking layer disposed between the third intermediate electron transport layer and the third light emitting layer BEML-3.

The fourth stack ST4 may include a third intermediate hole transport region MHTR3 that transports holes generated from the third charge generation layer CGL3 to the fourth light emitting layer GEML, and an electron transport region ETR that transports the electrons provided from the second electrode CE to the fourth light emitting layer GEML.

The third intermediate hole transport region MHTR3 may include a third intermediate hole injection layer MHIL3 disposed on the third charge generation layer CGL3, and a third intermediate hole transport layer MHTL3 disposed on the third intermediate hole injection layer MHIL3. However, the disclosure may not be limited thereto, and the third intermediate hole transport region MHTR3 may further include at least one of the hole buffer layer, the light emitting auxiliary layer, and the electron blocking layer disposed on the third intermediate hole transport layer MHTL3.

The electron transport region ETR may include an electron transport layer ETL disposed on the fourth light emitting layer GEML, and an electron injection layer EIL disposed on the electron transport layer ETL. However, the disclosure may not be limited thereto, and the electron transport region ETR may further include at least one of the electron buffer layer and the hole blocking layer disposed between the electron transport layer ETL and the fourth light emitting layer GEML.

In an embodiment, the light emitting element OLED may emit the light from the first electrode AE toward the second electrode CE. Based on the direction in which the light is emitted, the hole transport region HTR may be disposed at a lower portion of the stacks ST1, ST2, ST3, and ST4, and the electron transport region ETR may be disposed at an upper portion of the stacks ST1, ST2, ST3, and ST4. However, the disclosure may not be limited thereto, and the light emitting element OLED may have, based on the direction in which the light is emitted, an inverted device structure in which the electron transport region ETR is disposed at the lower portion of the stacks ST1, ST2, ST3, and ST4, and the hole transport region HTR is disposed at the upper portion of the stacks ST1, ST2, ST3, and ST4.

Figure 9:
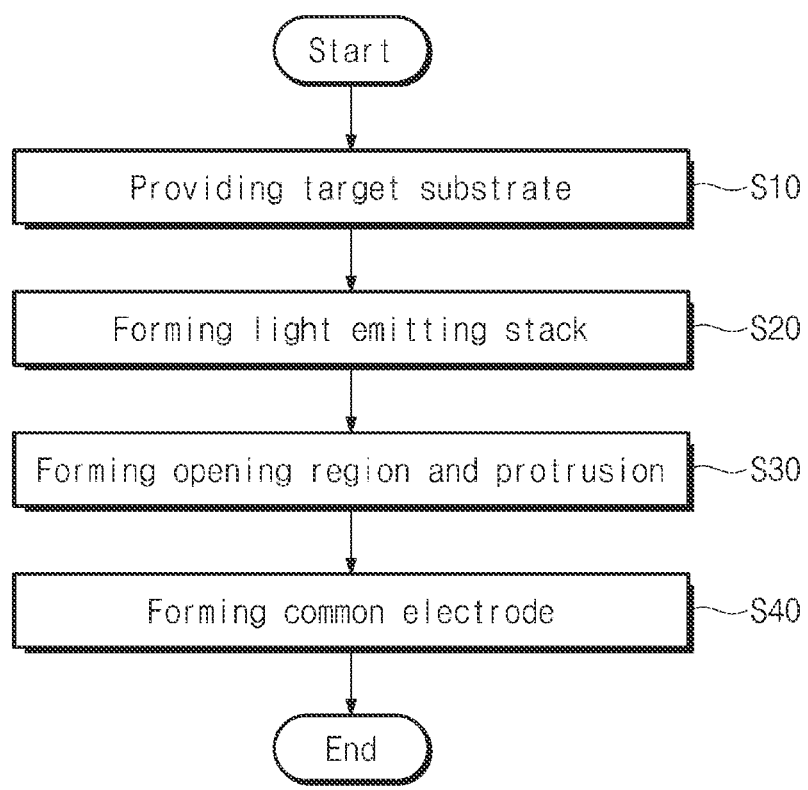
FIG. 9 is a schematic flowchart illustrating a method for manufacturing a display panel according to an embodiment of the disclosure.

FIG. 9 is a schematic flowchart illustrating a method for manufacturing a display panel according to an embodiment of the disclosure. FIGS. 10A to 10D are schematic cross-sectional views corresponding to respective operations of a method for manufacturing a display panel according to an embodiment of the disclosure. Each of the schematic cross-sectional views shown in FIGS. 10A to 10D illustrates as an example an operation of manufacturing the display panel DP including the embodiment shown in FIG. 7B.

Referring to FIG. 9, the method for manufacturing a display panel according to an embodiment may include providing a target substrate (S10), forming a light emitting stack (S20), forming an opening region and a protrusion (S30), and forming a common electrode (S40).

Providing the target substrate (S10) may include providing the target substrate on which the pixel electrode and the auxiliary electrode are formed. Forming the light emitting stack (S20) may include an operation of depositing the light emitting stack including the organic layers and the charge generation layer, on the pixel electrode and the auxiliary electrode.

Forming an opening region and a protrusion (S30) may include an operation of forming the hole penetrating the components of the light emitting stack disposed to overlap the auxiliary electrode by the laser drilling, and the region in which the hole is formed may be defined as the opening region. In forming the opening region, the organic layer of the light emitting stack adjacent to the opening region may push the charge generation layer outwardly of the opening region by the laser. In this process, the inner surface of the charge generation layer may be bent. In addition, the portion of the organic layer of the light emitting stack exposed to the laser may be formed with (or may have) the protrusion protruding upward by the pushing force outwardly of the opening region.

Forming the common electrode (S40) may include an operation of depositing the common electrode on the light emitting stack overlapping the pixel electrode and the opening region. Accordingly, it is possible to form the common electrode facing the pixel electrode and electrically connected to the auxiliary electrode through the opening region.

Figure 10A:
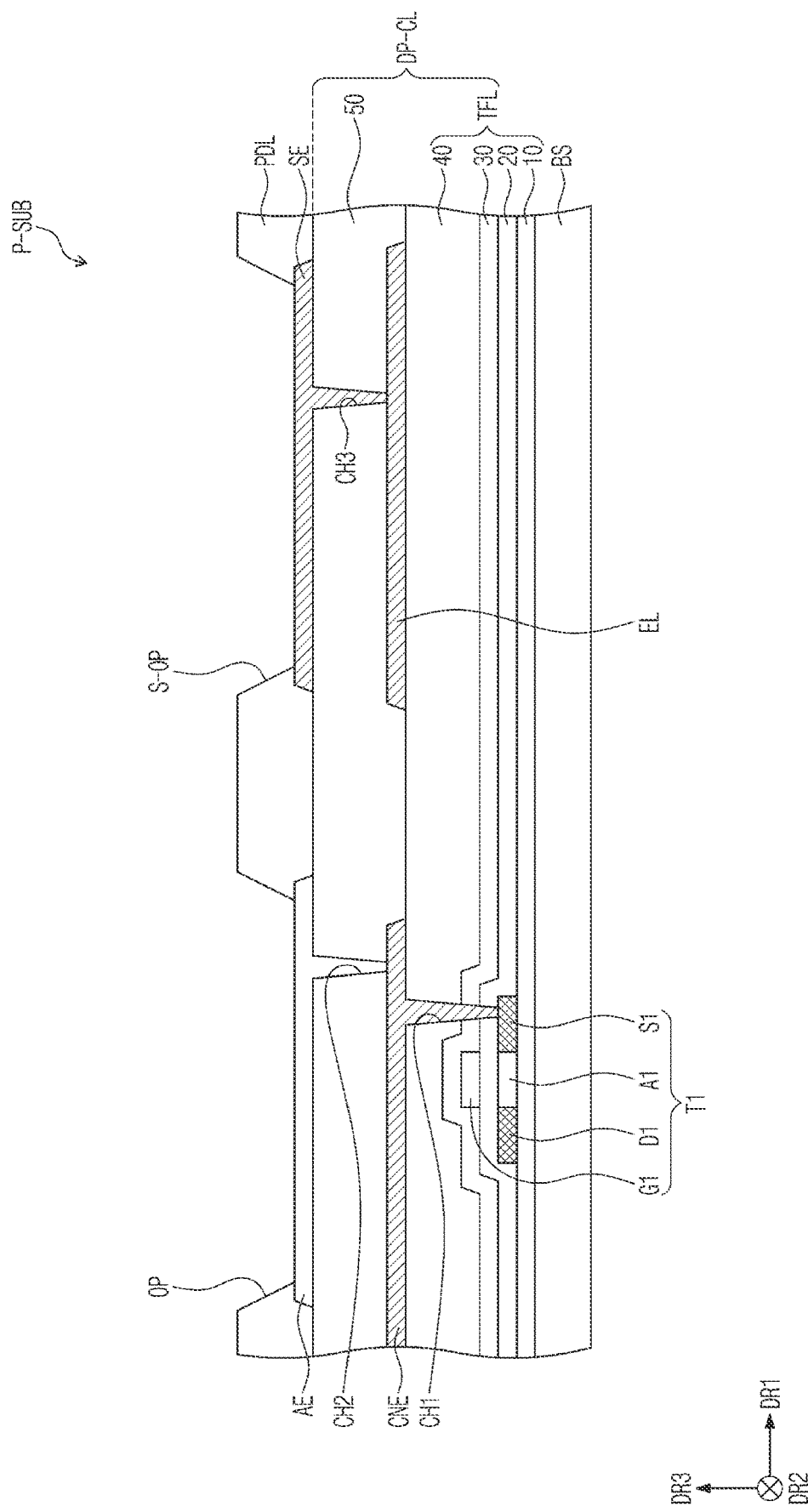
FIGS. 10A to 10D are schematic cross-sectional views corresponding to respective operations of a method for manufacturing a display panel according to an embodiment of the disclosure.

FIG. 10A illustrates as an example a cross-section of a target substrate P-SUB provided in providing the target substrate (S10). Referring to FIG. 10A, the target substrate P-SUB may include a pixel electrode AE and the auxiliary electrode SE spaced apart from the pixel electrode AE. The target substrate P-SUB may correspond to a substrate in an operation before forming the light emitting stack OU on the pixel electrode AE and the auxiliary electrode SE.

The auxiliary electrode SE and the pixel electrode AE may be disposed on a same layer, and may be formed by a same process. The fourth insulating layer 50 may be formed on the third insulating layer 40 by a process such as spin coating or chemical vapor deposition. The contact holes CH2 and CH3 penetrating the fourth insulating layer 50 may be formed by the patterning. A metal layer may be deposited and patterned on the fourth insulating layer 50 to form the pixel electrode AE and the auxiliary electrode SE. In an embodiment, the pixel electrode AE and the auxiliary electrode SE may contain a same material. The auxiliary electrode SE may be formed simultaneously in the patterning process for forming the pixel electrode AE. The process may be simplified by not adding a separate patterning process for forming the auxiliary electrode SE.

The pixel defining layer PDL may be formed between the pixel electrode AE and the auxiliary electrode SE. The pixel defining layer PDL may be manufactured by forming a preliminary pixel defining layer on the pixel electrode AE and the auxiliary electrode SE by a process such as coating or deposition, and forming the light emitting opening OP exposing a portion of the pixel electrode AE and the opening S-OP exposing a portion of the auxiliary electrode SE in the preliminary pixel defining layer by a mask process. The pixel defining layer PDL has a thickness (e.g., a predetermined or selected thickness), so that a gap may exist between an edge of the pixel electrode AE and a common electrode CE (see FIG. 10D) to be formed later. Accordingly, by preventing an electric field from being concentrated at the edge of the pixel electrode AE, a short circuit between the pixel electrode AE and the common electrode CE (see FIG. 10D) may be prevented.

Figure 10B:
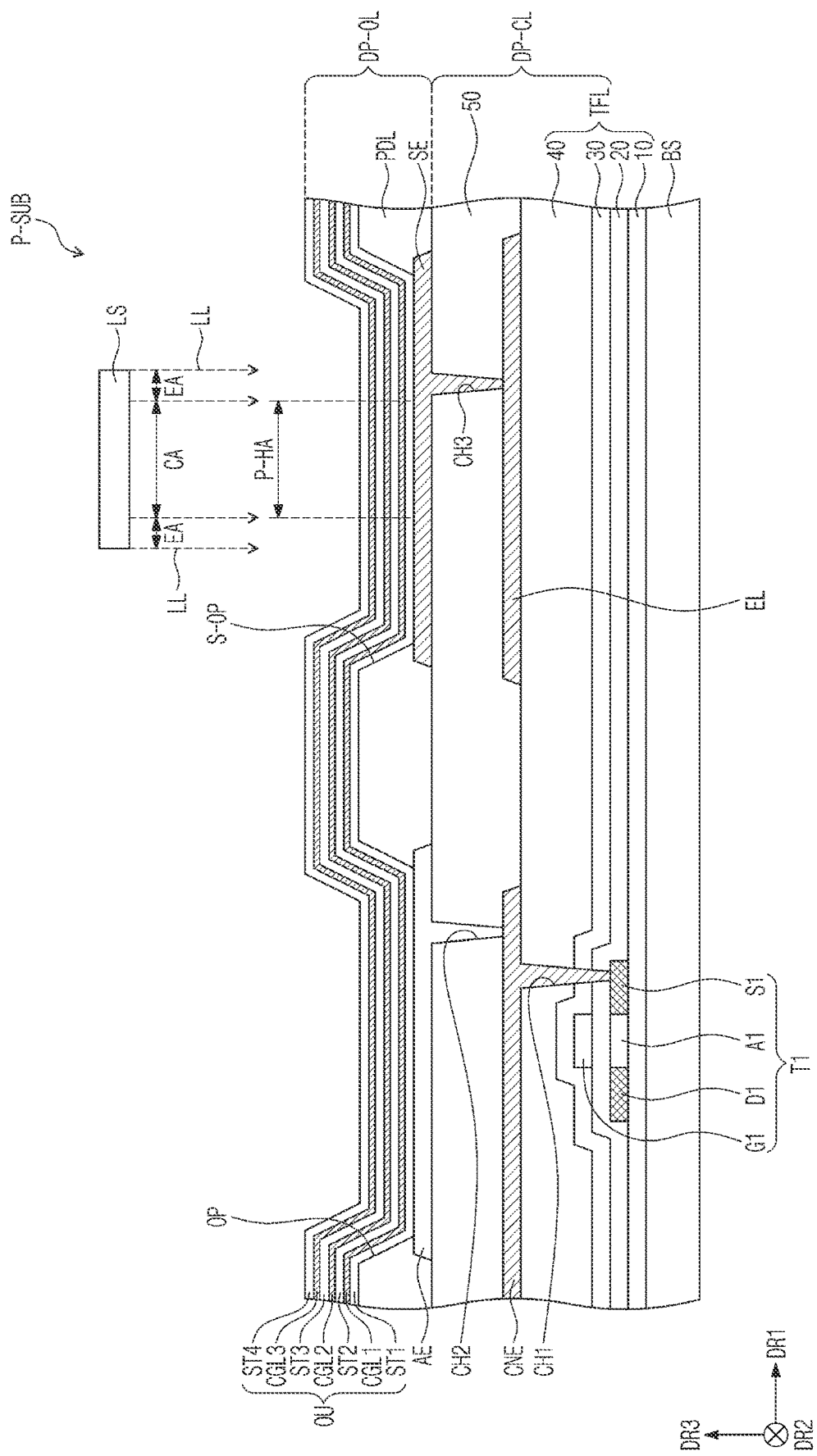

The target substrate P-SUB in FIG. 10B corresponds to a target substrate after forming the light emitting stack (S20). An operation shown in FIG. 10B may correspond to forming an opening region and a protrusion (S30). Referring to FIG.

10B, the light emitting stack OU may be formed on the target substrate P-SUB in FIG. 10A. The above description may be applied to the components of the light emitting stack OU, and a description will be made focusing on the formation process.

The first to fourth organic layers ST1, ST2, ST3, and ST4 (or the first to fourth stacks) and the first to third charge generation layers CGL1, CGL2, and CGL3 included in the light emitting stack OU may be formed in common in the light emitting region PXA and the non-light emitting region NPXA. The functional layers and the light emitting layers included in the first to fourth organic layers ST1, ST2, ST3, and ST4 may be formed as the common layer using an open mask. However, the disclosure may not be limited thereto, and the light emitting layers included in the first to fourth organic layers ST1, ST2, ST3, and ST4 may be formed in a form of a light emitting pattern disposed to correspond to the pixel electrode AE.

A portion of each of the first to fourth organic layers ST1, ST2, ST3, and ST4 and the first to third charge generation layers CGL1, CGL2, and CGL3 formed in common in the light emitting region PXA and the non-light emitting region NPXA may be formed on the auxiliary electrode SE. A preliminary hole region P-HA in which the opening regions penetrating the first to fourth organic layers ST1, ST2, ST3, and ST4 and the first to third charge generation layers CGL1, CGL2, and CGL3 are to be formed later may be defined in the first to fourth organic layers ST1, ST2, ST3, and ST4 and the first to third charge generation layers CGL1, CGL2, and CGL3 overlapping the auxiliary electrode SE.

A light irradiator LS may be provided above the light emitting stack OU to correspond to the preliminary hole region P-HA. The light irradiator LS may irradiate a laser LL toward the preliminary hole region P-HA of the light emitting stack OU.

The laser LL may be provided as a Gaussian beam having excellent uniformity of intensity. In case that the hole is formed using a laser with lowered uniformity, the phenomenon such as the insufficient removal of the portion of the light emitting stack corresponding to the preliminary hole region or the occurrence of the crack may occur as described above. However, in case that the hole is formed using the laser LL having excellent or desired uniformity, process reliability and precision may be improved. Accordingly, reliability of the display panel DP manufactured using the method for manufacturing a display panel according to the disclosure may also be improved.

A wavelength of the laser LL may be included in an ultraviolet wavelength range. For example, the wavelength of the laser LL may be equal to or greater than about 300 nm and equal to or smaller than about 400 nm. However, the wavelength of the laser LL is not limited to the above numerical example.

Energy for each unit area of the laser LL may be equal to or lower than about 200 mJ/cm$^2$. Specifically, the energy for each unit area of the laser LL may be equal to or higher than about 50 mJ/cm$^2$ and equal to or lower than about 200 mJ/cm$^2$. In case that the energy for each unit area of the laser LL is lower than about 50 mJ/cm$^2$, the components of the light emitting stack OU corresponding to the preliminary hole region P-HA may be insufficiently removed. In case that the energy for each unit area of laser LL is equal to or higher than about 200 mJ/cm$^2$, the auxiliary electrode SE formed beneath the light emitting stack OU may be damaged.

The laser LL may have a circular phase in a plan view. The phase of the laser LL may include a central region CA and an edge region EA surrounding the central region CA. An intensity of the laser LL corresponding to the central region CA may be greater than an intensity of the laser LL corresponding to the edge region EA.

The intensity of the laser LL corresponding to the central region CA may be sufficient to remove the first to fourth organic layers ST1, ST2, ST3, and ST4 and the first to third charge generation layers CGL1, CGL2, and CGL3. After a position of the light irradiator LS is adjusted such that the central region CA of the laser LL to be irradiated to the preliminary hole region P-HA, the light irradiator LS may irradiate the laser LL onto the preliminary hole region P-HA.

A diameter of the central region CA of the laser LL may be defined as a size of the laser LL. In an embodiment, the size of the laser LL may be equal to or greater than about 8 μm and equal to or smaller than about 14 μm. However, the size of the laser LL is not limited to the above numerical example.

The intensity of the laser LL corresponding to the edge region EA may be less than a threshold value of the laser intensity required to remove the light emitting stack OU. A portion of each of the first to fourth organic layers ST1, ST2, ST3, and ST4 of the light emitting stack OU irradiated with the laser LL and overlapping the edge region EA may be deformed. In particular, the fourth organic layer ST4 irradiated with the laser LL at the shortest distance may be affected by a structure of a material forming the fourth organic layer ST4 by the laser LL.

A diameter of the edge region EA of the laser LL may be larger than the diameter of the central region CA. For example, the diameter of the edge region EA of the laser LL may be about 20% to about 40% larger than the diameter of the central region CA. The diameter of the edge region EA of the laser LL may be equal to or greater than about 9 μm and equal to or smaller than about 19 μm. However, the size of the edge region EA of the laser LL is not limited to the above numerical example.

Figure 10C:
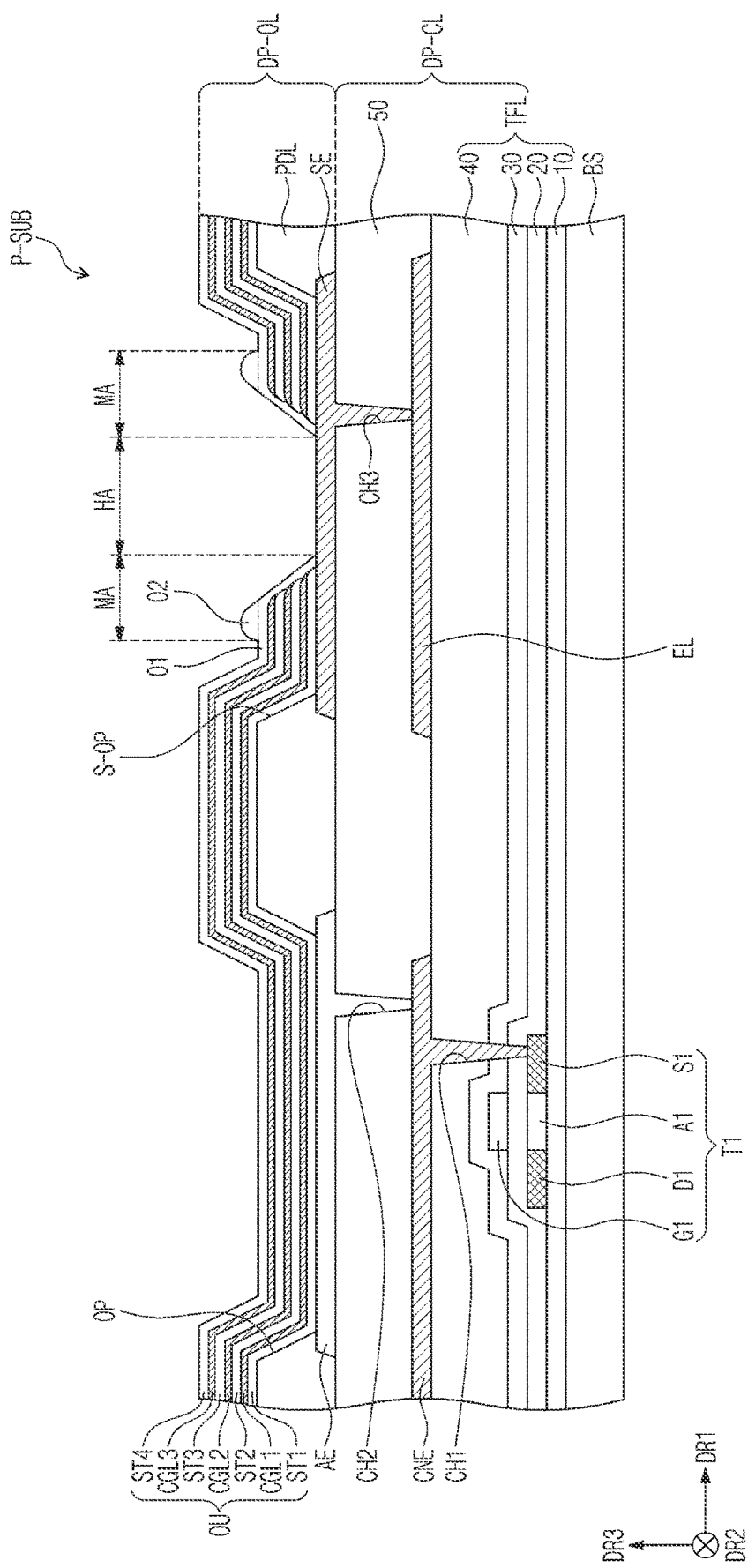

The target substrate P-SUB in FIG. 10C may correspond to a substrate in which the opening region corresponding to the hole region HA and the protrusion O2 are formed in the light emitting stack OU. The above description may be applied to descriptions of the components of the opening region and the protrusion O2.

Referring to FIG. 10C, the hole region HA penetrating the light emitting stack OU and exposing the portion of the auxiliary electrode SE may be formed corresponding to the central region CA of the laser LL. The opening regions respectively overlapping the components of the light emitting stack OU formed overlapping the auxiliary electrode SE may be formed, and the opening regions may expose the auxiliary electrode SE while defining the integral hole region HA. The hole region HA may have a circular shape in a plan view, similar to the phase of the laser LL. A diameter of the hole region HA may be substantially equal to or smaller than the size of the laser LL (for example, the diameter of the central region CA of the laser LL described above). Therefore, by adjusting the size of the laser LL, the size of the hole region HA may be varied.

A protrusion O2 protruding upward may be formed on a first portion O1 of the fourth organic layer ST4 of the light emitting stack OU corresponding to the edge region EA of the laser LL. The protrusion O2 may have a ring shape surrounding the opening region of the fourth organic layer ST4 in a plan view, corresponding to the phase of the edge region EA of the laser LL. The opening region of the fourth organic layer ST4 may correspond to the hole region HA, and the protrusion O2 may surround the hole region HA in a plan view. A region from an edge of the opening region of the fourth organic layer ST4 to the edge of the protrusion O2 may be referred to as the protrusion region MA.

The fourth organic layer ST4 may push out the components disposed beneath the fourth organic layer ST4 outwardly of the hole region HA by the laser LL (see FIG. 10B). Accordingly, the inner surfaces of the first to third charge generation layers CGL1, CGL2, and CGL3 disposed beneath the fourth organic layer ST4 and adjacent to the hole region HA may be bent. Specifically, the inner surfaces of the first to third charge generation layers CGL1, CGL2, and CGL3 may be bent downward in the protrusion region MA.

The protrusion O2 that protrudes upward may be formed on the fourth organic layer ST4 by a force acting in the fourth organic layer ST4 while the laser LL (see FIG. 10B) is irradiated. The protrusion O2 may be formed on the third charge generation layer CGL3 most adjacent to the common electrode CE to be formed later.

In an example, the first to third organic layers ST1, ST2, and ST3 may also be partially deformed under the influence of the laser LL (see FIG. 10B). A portion of each of the first to third organic layers ST1, ST2, and ST3 overlapping the protrusion region MA may be bent, and accordingly, the first and second charge generation layers CGL1 and CGL2 disposed between the first to third organic layers ST1, ST2, and ST3 may also overlap the protrusion region MA and be bent.

Figure 10D:
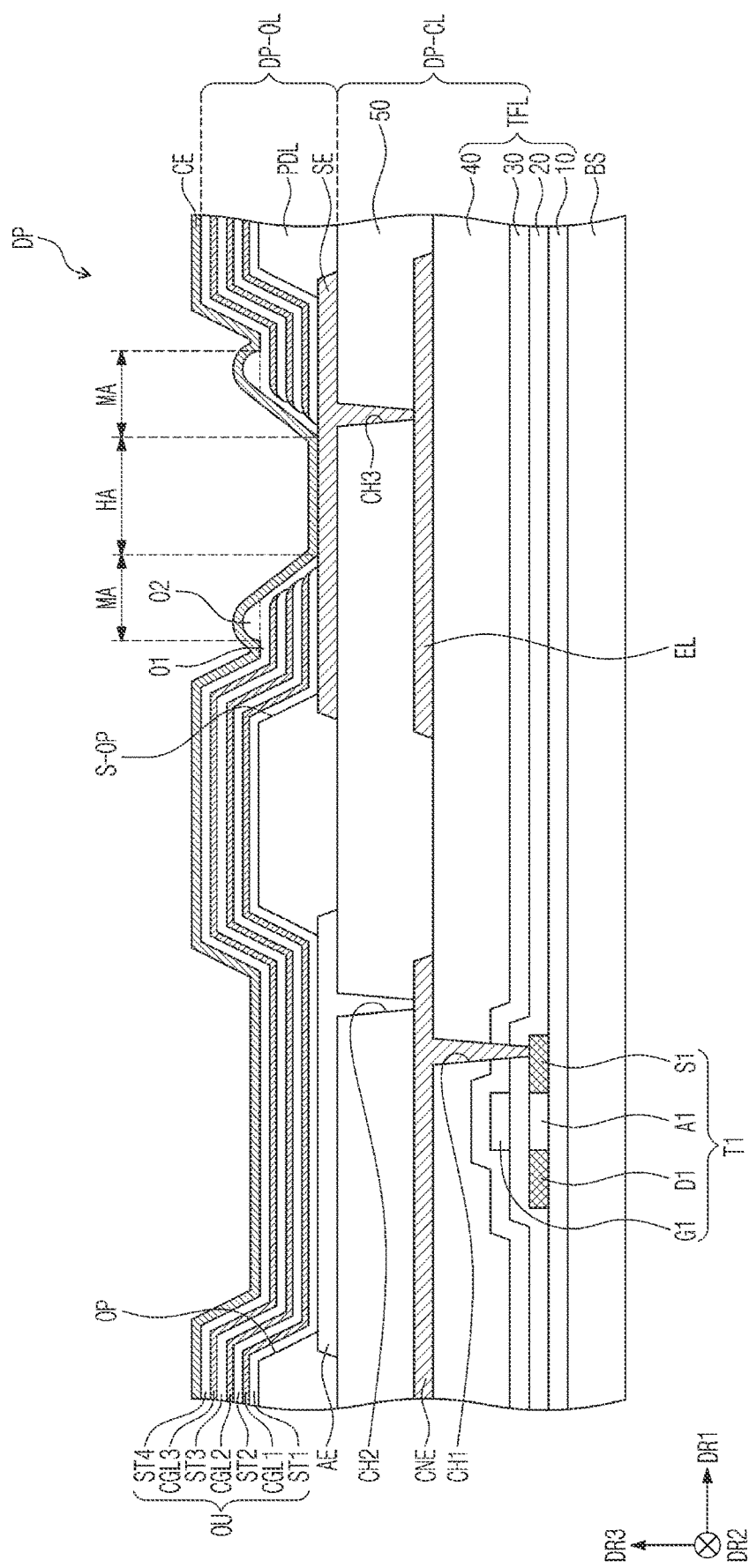

FIG. 10D illustrates a cross-section of the display panel DP in which the common electrode CE is formed in forming the common electrode (S40). The common electrode CE may be formed by a deposition process to overlap the pixel electrode AE, the auxiliary electrode SE, and the hole region HA.

The sides of the charge generation layers CGL1, CGL2, CGL3, and CGL4 respectively adjacent to the opening regions of the charge generation layers CGL1, CGL2, CGL3, and CGL4 formed using the laser LL (see FIG. 10B) of an embodiment of the disclosure may be bent. Accordingly, each of the charge generation layers CGL1, CGL2, CGL3, and CGL4 may be spaced apart from the common electrode CE formed in the hole region HA. In addition, the protrusion O2 may be formed on the organic layer of the light emitting stack OU at the same time in forming the opening region, and the charge generation layer disposed adjacent to the common electrode CE and the common electrode CE may be spaced apart from each other by the protrusion. Therefore, the method for manufacturing a display panel according to an embodiment may form the hole region HA for contacting the auxiliary electrode SE and the common electrode CE to each other, and at the same time, prevent a portion of the common electrode CE, adjacent to the hole region HA, from contacting the charge generation layers CGL1, CGL2, CGL3, and CGL4. Accordingly, an occurrence of the leakage current to the charge generation layers CGL1, CGL2, CGL3, and CGL4 may be prevented, and the display panel DP with the improved reliability may be manufactured.

In an example, the method for manufacturing a display panel according to an embodiment may further include an operation of forming the capping layer CPL (see FIG. 7B) and the encapsulation layer TFE (see FIG. 5) on the common electrode CE. A process operation after forming the common electrode CE may vary depending on the components of the display panel DP and may not be limited to an embodiment.

The display panel according to an embodiment may prevent the IR drop phenomenon by bringing the second electrode into contact with the auxiliary electrode to which the second voltage is applied. The display panel according to an embodiment may include the light emitting stack including the at least one charge generation layer, and may prevent the leakage current occurred by the contact between the charge generation layer and the second electrode as the charge generation layer is spaced apart from the second electrode. Accordingly, the phenomenon in which the light is emitted brighter in some regions by the leakage current may be prevented, and the display panel may emit the light with the uniform luminance.

The display panel according to an embodiment may use the laser beam with the improved uniformity to form the opening region that penetrates the light emitting stack and connects the second electrode and the auxiliary electrode to each other. During the process of forming the opening region, the organic layer of the light emitting stack adjacent to the opening region may push out the charge generation layer, and accordingly, the inner surface of the charge generation layer may be bent and spaced apart from the second electrode. In an embodiment, the organic layer of the light emitting stack may form the protrusion adjacent to the opening region by the laser, and the charge generation layer may be spaced apart from the second electrode with the protrusion interposed therebetween. Using the method for manufacturing a display panel according to an embodiment, it is possible to manufacture the display panel having the uniform luminance by forming the hole for connecting the second electrode and the auxiliary electrode to each other, and at the same time, preventing the contact between the charge generation layer and the second electrode.

The display panel of an embodiment of the disclosure may connect the auxiliary electrode and the second electrode to each other, thereby minimizing the IR drop. The display panel of an embodiment of the disclosure may insulate the second electrode connected to the auxiliary electrode from the charge generation layer, thereby minimizing the leakage current and providing an image of uniform luminance.

The method for manufacturing a display panel according to an embodiment of the disclosure may form the hole connecting the auxiliary electrode and the second electrode to each other, and at the same time, space the charge generation layer apart from the second electrode, thereby manufacturing the display panel with the uniform luminance.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:
1. A display panel comprising:
a circuit layer disposed on a base substrate;
a first electrode disposed in a first region on the circuit layer;
an auxiliary electrode disposed in a second region on the circuit layer and spaced apart from the first electrode;

a charge generation layer disposed on the first electrode and the auxiliary electrode, a first opening region being defined in the charge generation layer;

a second electrode disposed on the charge generation layer;

a first organic layer disposed between the first electrode and the charge generation layer, a second opening region being defined in the first organic layer; and a second organic layer disposed between the charge generation layer and the second electrode, a third opening region being defined in the second organic layer, wherein the second electrode is electrically connected to the auxiliary electrode through the first, second, and third opening regions, and the second organic layer includes a protrusion of the second organic layer adjacent to the third opening region.

2. The display panel of claim 1, wherein
the charge generation layer includes a curved surface adjacent to the first opening region, and
the second electrode is spaced apart from the curved surface of the charge generation layer.

3. The display panel of claim 2, wherein the second organic layer covers the curved surface of the charge generation layer.

4. The display panel of claim 2, wherein the curved surface of the charge generation layer overlaps the protrusion of the second organic layer in a plan view.

5. The display panel of claim 1, wherein the protrusion of the second organic layer surrounds the third opening region in a plan view.

6. The display panel of claim 1, wherein
the protrusion of the second organic layer has a ring shape surrounding the third opening region in a plan view, and
a diameter of the protrusion of the second organic layer is equal to or greater than about 1.2 times and equal to or smaller than about 1.4 times a diameter of the third opening region.

7. The display panel of claim 1, wherein a thickness from a top surface of the protrusion of the second organic layer to a bottom surface of the first organic layer is equal to or greater than about 1.3 times and equal to or smaller than about 1.5 times a thickness from a top surface of a portion of the second organic layer not overlapping the protrusion of the second organic layer to the bottom surface of the first organic layer.

8. The display panel of claim 1, wherein the charge generation layer contains a metallic material.

9. The display panel of claim 1, wherein a thickness of the charge generation layer is equal to or greater than about 1 angstrom (Å) and equal to or smaller than about 150 angstrom (Å).

10. The display panel of claim 1, wherein
the first organic layer includes a first light emitting layer overlapping the first electrode in a plan view,
the second organic layer includes a second light emitting layer overlapping the first electrode in a plan view, and
a color of light emitted from the first light emitting layer is different from a color of light emitted from the second light emitting layer.

11. The display panel of claim 1, wherein
the first organic layer includes a first light emitting layer overlapping the first electrode in a plan view,
the second organic layer includes a second light emitting layer overlapping the first electrode in a plan view, and
a color of light emitted from the first light emitting layer is substantially identical to a color of light emitted from the second light emitting layer.

12. The display panel of claim 1, further comprising:
a capping layer disposed on the second electrode; and
an encapsulation layer disposed on the capping layer,
wherein the encapsulation layer includes:
a plurality of inorganic films; and
at least one organic film disposed between the plurality of inorganic films.

13. An electronic device comprising:
a display panel that is capable of displaying an image;
an electronic module disposed beneath the display panel; and
a casing accommodating the display panel and the electronic module, wherein
the display panel includes:
a circuit layer disposed on a base substrate;
a first electrode disposed in a first region on the circuit layer;
an auxiliary electrode disposed in a second region on the circuit layer and spaced apart from the first electrode;
a second electrode disposed on the first electrode and the auxiliary electrode;
a plurality of organic layers disposed between the first electrode and the second electrode; and
at least one charge generation layer disposed between the plurality of organic layers, wherein
each organic layer of the plurality of organic layers and the charge generation layer includes an opening region directly over the auxiliary electrode,
the second electrode is electrically connected to the auxiliary electrode through each opening region of the plurality of organic layers and the charge generation layer,
an organic layer disposed adjacent to the second electrode among the plurality of organic layers includes a protrusion adjacent to the opening region of the organic layer disposed adjacent to the second electrode, and
at least another organic layer besides the organic layer disposed adjacent to the second electrode includes no protrusion adjacent to the opening region.

14. The electronic device of claim 13, wherein
the charge generation layer includes a curved surface adjacent to the opening region,
the curved surface of the charge generation layer is spaced apart from the second electrode, and
the protrusion of the organic layer is disposed between the curved surface of the charge generation layer and the second electrode.

15. The electronic device of claim 13, wherein
the protrusion of the organic layer disposed adjacent to the second electrode surrounds the opening region of each opening region of the plurality of organic layers in a plan view, and
the organic layer disposed adjacent to the second electrode directly contacts at least one of the auxiliary electrode and another organic layer of the plurality of organic layers.

16. A method for manufacturing a display panel, the method comprising:
providing a target substrate including:
a pixel electrode; and
an auxiliary electrode, the auxiliary electrode and the pixel electrode being disposed on a same layer;

forming a light emitting stack including a charge generation layer on the pixel electrode and the auxiliary electrode;

forming an opening region penetrating the light emitting stack and forming a protrusion adjacent to the opening region by irradiating a laser onto the light emitting stack overlapping the auxiliary electrode in a plan view; and forming a common electrode on the light emitting stack, wherein the common electrode is electrically connected to the auxiliary electrode through the opening region.

17. The method of claim 16, wherein the forming of the opening region includes:

bending an end of the charge generation layer adjacent to the opening region, wherein the common electrode formed to overlap the opening region in a plan view is spaced apart from the end of the charge generation layer.

18. The method of claim 16, wherein the laser is a Gaussian beam.

19. The method of claim 16, wherein a fluence of the laser is equal to or lower than about 200 mJ/cm$^2$.

20. The method of claim 16, wherein a wavelength of the laser is equal to or greater than about 300 nm and equal to or smaller than about 400 nm.

21. The method of claim 16, wherein the protrusion of the light emitting stack is formed simultaneously in the forming of the opening region by the laser, and the protrusion of the light emitting stack surrounds the opening region in a plan view.

* * * * *